United States Patent [19]

Fueki et al.

[11] Patent Number: 5,262,341
[45] Date of Patent: Nov. 16, 1993

[54] BLANKING APERTURE ARRAY AND CHARGED PARTICLE BEAM EXPOSURE METHOD

[75] Inventors: Shunsuke Fueki; Hiroshi Yasuda, both of Yokohama; Kiichi Sakamoto, Tokyo; Yasushi Takahashi, Kawasaki, all of Japan

[73] Assignee: Fujitsu Limited, Kawasaki, Japan

[21] Appl. No.: 991,718

[22] Filed: Dec. 16, 1992

Related U.S. Application Data

[60] Continuation of Ser. No. 893,006, Jun. 3, 1992, abandoned, which is a division of Ser. No. 525,062, May 18, 1990, Pat. No. 5,144,142.

[30] Foreign Application Priority Data

| May 19, 1989 | [JP] | Japan | 1-126121 |
| Sep. 14, 1989 | [JP] | Japan | 1-239623 |
| Sep. 25, 1989 | [JP] | Japan | 1-248835 |

[51] Int. Cl.$^5$ ......................................... H01L 21/268
[52] U.S. Cl. ................................... 437/51; 437/924; 437/935
[58] Field of Search ............ 437/48, 51, 924, 930, 437/935; 148/DIG. 102; 250/396 R, 492.2

[56] References Cited

U.S. PATENT DOCUMENTS

| 4,130,761 | 12/1978 | Matsuda | 250/398 |
| 4,153,843 | 5/1979 | Pease | 250/396 R |
| 4,409,487 | 10/1983 | Kuschel et al. | 250/398 |
| 4,472,636 | 9/1984 | Hahn | 250/398 |
| 4,633,090 | 12/1986 | Hahn | 250/398 |
| 4,724,328 | 2/1988 | Lischke | 250/396 R |
| 4,839,520 | 6/1989 | Garth | 250/396 R |
| 4,876,112 | 10/1989 | Kaito et al. | 437/935 |
| 4,980,567 | 12/1990 | Yasuda et al. | 250/492.2 |
| 4,982,099 | 1/1991 | Lischke | 250/396 R |
| 5,026,664 | 6/1991 | Hongo et al. | 437/935 |

FOREIGN PATENT DOCUMENTS

| 0221657 | 5/1987 | European Pat. Off. |
| 2385222 | 10/1978 | France |
| 56-19402 | 5/1981 | Japan |

OTHER PUBLICATIONS

European Search Report, The Hague, search completed May 1991.

Primary Examiner—Brian E. Hearn
Assistant Examiner—C. Chaudhari
Attorney, Agent, or Firm—Staas & Halsey

[57] ABSTRACT

A blanking aperture array for use in a charged particle beam exposure has a substrate, at least m rows by n columns of apertures arranged two-dimensionally in the substrate, where each of the apertures have a pair of blanking electrodes and m and n are integers greater than one, and n m-bit shift registers provided on the substrate for applying voltages dependent on pattern data to m pairs of the blanking electrodes of the apertures in the ith column, where i=1, 2, . . . , n. The pattern data is related to a pattern which is to be exposed using the blanking aperture array.

5 Claims, 23 Drawing Sheets

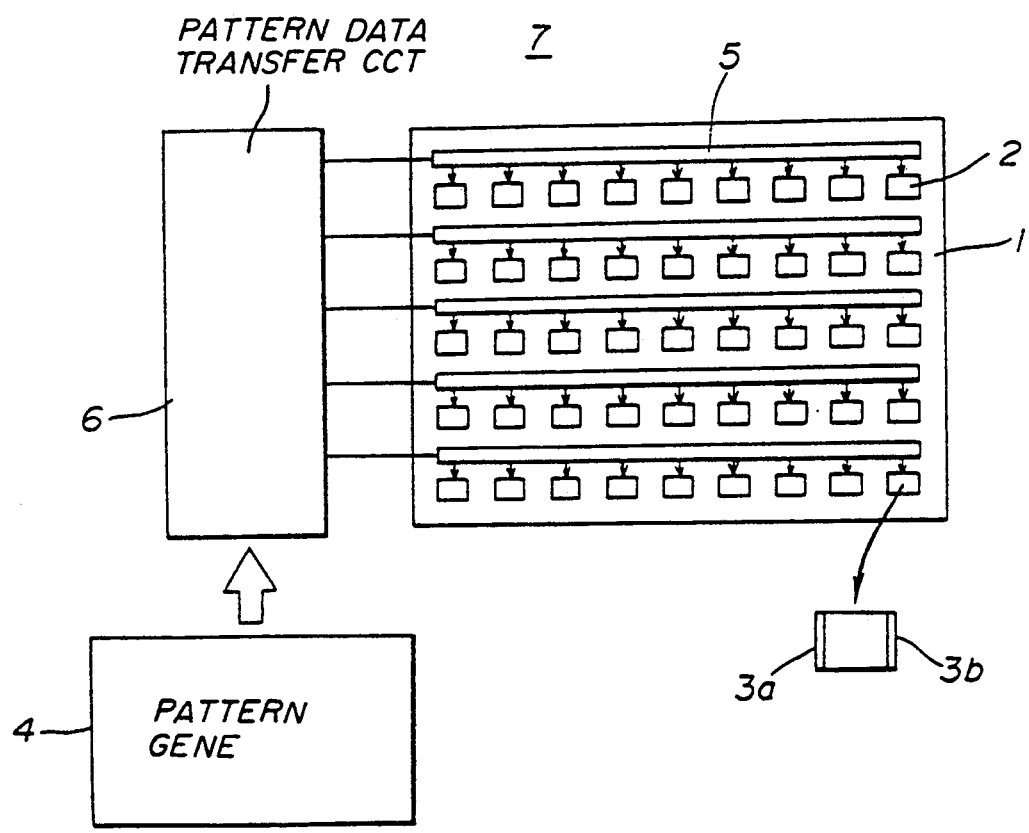

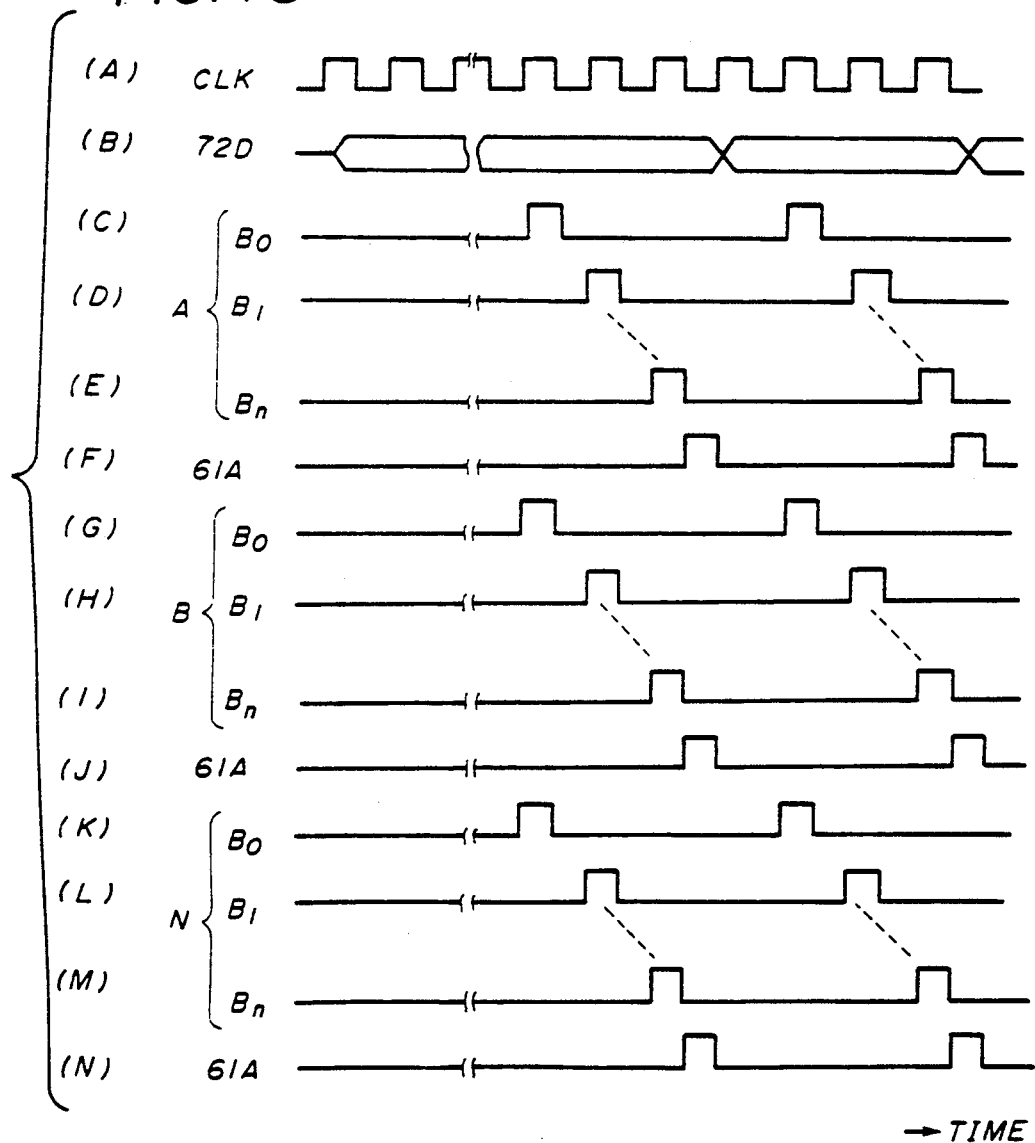

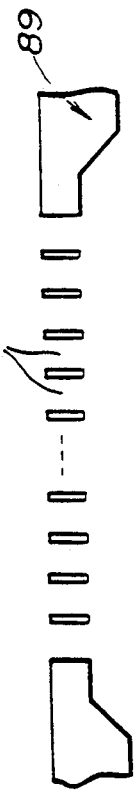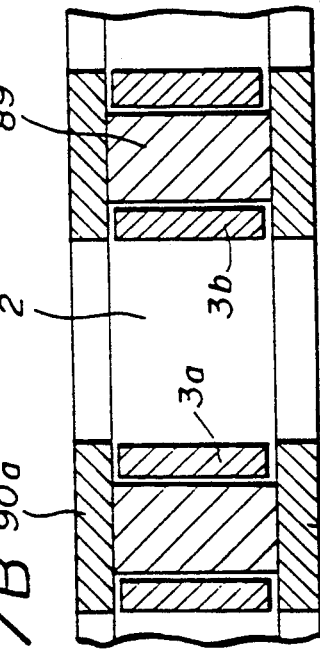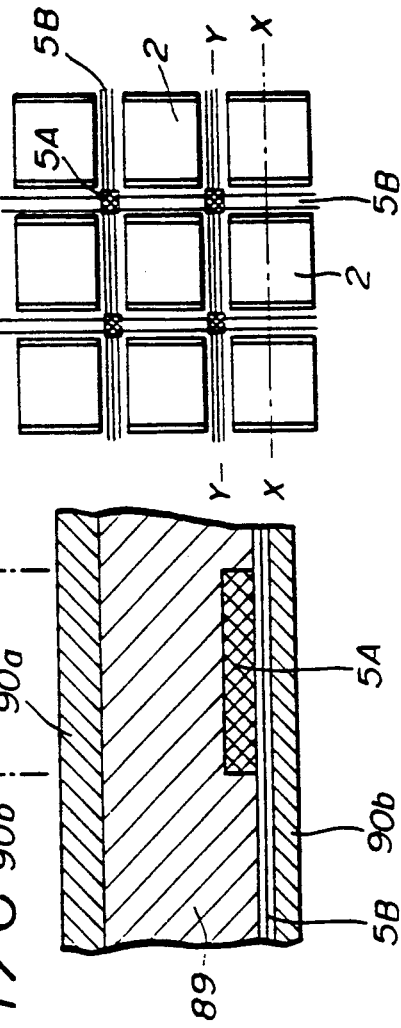

BACK SURFACE ETCHING

BLANKING APERTURE ARRAY AND CHARGED PARTICLE BEAM EXPOSURE METHOD

This is a continuation of application Ser. No. 07/893,006, filed Jun. 3, 1992, now abandoned, which is in turn a divisional application Ser. No. 07/525,062, filed May 18, 1990, now U.S. Pat. No. 5,144,142.

BACKGROUND OF THE INVENTION

The present invention generally relates to blanking aperture arrays, methods of producing blanking aperture arrays, charged particle beam exposure apparatuses and charged particle beam exposure methods, and more particularly to a blanking aperture array which uses a shift register, a method of producing such a blanking aperture array, a charged particle beam exposure apparatus which employs such a blanking aperture array and a charged particle beam exposure method which uses such a blanking aperture array.

Recently, the integration density and functions of integrated circuits (ICs) have improved considerably, and the ICs are expected to play a major role in bringing out the technical advancement of the industry as a whole, including the use on computers, communication equipments and the like.

The gist of the IC production technology lies in the improvement of the integration density of fine patterns. The patterning limit of the photolithography is in the order of 0.3 $\mu$m. However, in the case of the charged particle beam exposure which uses electron, ion or x-ray beams, it is possible to make patterns which have a size of 0.1 $\mu$m or less with a positioning accuracy of 0.05 $\mu$m or less. Accordingly, if it is possible to realize a charged particle beam exposure apparatus which exposes a pattern of 1 cm$^2$ in approximately 1 second, this exposure technique will be far superior to other lithography techniques in terms of the fineness of the pattern exposed, the positioning accuracy, the quick turn-around and the reliability. In other words, when such a charged particle beam exposure apparatus is realized, it will become possible to produce 1 to 4 Gbit memories and 1M gate LSIs.

There are various types of charged particle beam exposure apparatuses. There is the point beam type which uses a beam which is formed to a spot shape, and there is the variable rectangular beam type which uses a beam with a rectangular cross section and variable size. On the otherhand, there is the stencil mask type which uses a stencil to form the cross section of the beam into a predetermined shape, and there is the type which uses a blanking aperture array to form the cross section of the beam into a predetermined shape.

The point beam type charged particle beam exposure apparatus has a poor throughput and is only used for research and development purposes. The variable rectangular beam type charged particle beam exposure apparatus has a throughput which is improved by one or two digits when compared to the throughput of the point beam type charged particle beam exposure apparatus. However, when exposing a pattern in which fine patterns in the order of 0.1 $\mu$m are integrated with a high integration density, the variable rectangular beam type charged particle beam exposure apparatus still has a poor throughput. On the other hand, the stencil mask type charged particle beam exposure apparatus uses a stencil mask which has a plurality of repeating pattern transmission apertures at the part corresponding to the variable rectangular aperture. For this reason, the stencil type charged particle beam exposure apparatus is advantageous when exposing a repeating pattern, and the throughput is improved when compared to the throughput of the variable rectangular beam type charged particle beam exposure apparatus.

FIG. 1A generally shows a stencil type charged particle beam exposure apparatus. A convergent electromagnetic lens 212 is made up of a pair of convex electromagnetic lenses (not shown) having centers of spheres which match an optical axis 214. For the sake of convenience, the beam axis is referred to as the optical axis 214. One of the convex electromagnetic lenses forms a spherical surface 212a for the incoming light and the other of the convex electromagnetic lenses forms a spherical surface 212b for the outgoing light. A stencil mask 213 includes a variable rectangular transmission aperture 213a which coincides with the optical axis 214 and a plurality of repeating pattern transmission apertures 213b.

The beam incident position to the spherical surface 212a is determined by a deflection of an electrostatic deflector 211. For example, when selecting the variable rectangular transmission aperture 213a, the beam is incident to the spherical surface 213a at a position A, and the beam is similarly incident at a position B when the pattern transmission aperture 213b is selected. The incident position of the beam to the spherical surface 212a changes depending on the deflection of the electrostatic deflector 211, and the beam is transmitted through the stencil mask 213. The outgoing beam from the spherical surface 212b is returned to a path on the optical axis 214, and a pattern is transferred onto a wafer (not shown).

FIGS. 1C and 1D show examples of the mask pattern on the stencil mask which is to be transferred onto the wafer, and FIG. 1B shows an arrangement of the patterns on the mask shown in FIGS. 1C and 1D on the stencil mask 213. Patterns 213b and 213c are used as the pattern transmission apertures and are often used at connecting parts of interconnections. When drawing (exposing) the interconnections and the connecting parts thereof, the patterns 213b and 213c may respectively be used independently or used in groups as indicated by phantom lines. A patern 213a is used as the variable rectangular transmission aperture. When the beam which is formed to have a rectangular cross section is projected in a state where the aperture 213a is matched to the beam cross section and then shifted so that the aperture 213a and the beam cross section partially overlap, it is possible to change the beam cross section. When the beam having the rectangular cross section is projected on the patterns 213b and 213c, the beam only passes within the aperture shown and the beam cross section is shaped in accordance with the respective patterns.

According to the stencil mask, the patterns can be exposed in one operation and it is possible to improve the exposure speed. However, although the stencil meaks has a plurality of transmission apertures, the transfer patterns must be formed in advance as the stencil mask in accordance with the exposure. In addition, since the exposure region is finite, it is necessary to prepare a plurality of stencil mask for a semiconductor circuit which requires a plurality of patterns such that all the patterns cannot be accommodated within one stencil mask. In this case, it is necessary to use the plurality of stencils one by one, and the throughput greatly deteriorates because of the need to change the stencil mask.

As one method of eliminating the above described problems, there are proposals to use a two-dimensionally arranged blanking aperture array in place of the stencil mask. By use of the blanking aperture array, it is possible to transfer a pattern which has an arbitrary shape by simply changing signals applied to each of blanking electrodes.

According to the exposure method which employs the blanking aperture array, a large number of apertures are arranged two-dimensionally on a semiconductor crystal substrate made of silicon or the like, and a pair of blanking electrodes are formed in each of the apertures. A pattern data indicates the pattern which is to be transferred and determines those blanking electrodes which are to receive a voltage and those blanking electrodes which are not to receive a voltage. For example, when one of the pair of blanking electrodes of the aperture is grounded and the other blanking electrode receives a voltage, the electron beam which is transmitted through this aperture is bent. The bent electron beam is transmitted through a lens which is positioned below the blanking aperture array but is cut by an aperture so that the beam does not reach the wafer. On the other hand, when no voltage is applied to the blanking electrodes of the aperture, the electron beam is not bent and the electron beam is projected on the wafer via the lens and the aperture which does not cut the beam since the beam is not bent.

FIG. 2 generally shows a known electron beam exposure apparatus which employs the blanking aperture array. Only a brief description will be given of this known electron beam exposure apparatus. A blanking aperture array BAA forms the cross section of an electron beam EB into a dot pattern having a desired shape. The electron beam EB which is emitted from an electron gun EG is converged, deflected and input/output perpendicularly to the blanking aperture array BAA. The electron beam output from the blanking aperture array BAA is further converged, deflected and transmitted through an objective OL so as to be projected at a designated position on a wafer WF which is placed on a movable stage ST. The blanking aperture array BAA may be used together with the stencil having the variable rectangular aperture. In such a case, the electron beam is shifted as indicated by a phantom line so that the electron beam passes a desired position on the blanking aperture array BAA. Such shifting of the electron beam and the ON/OFF of each aperture of the blanking aperture array BAA is controlled by a pattern controller PCTL, and this pattern controller PCTL is controlled by a central processing unit CPU. In FIG. 2, MD denotes a magnetic disk apparatus, MT denotes a magnetic tape apparatus, D/A denotes a digital-to-analog converter, and G/S denotes a two-dimensional ON/OFF information generating/storing apparatus.

For example, the two-dimensional blanking aperture array comprises 200×200 apertures, and the electron beam which is transmitted through these apertures is formed into a maximum of 200×200 point beams. Because the apertures can be turned ON/OFF independently, it is possible to describe an arbitrary two-dimensional figure by the 200×200 dots. The electron beam which is transmitted through the blanking aperture array is reduced by a lens and is projected on the wafer in a region of 4 μm×4 μm as a maximum of 200×200 beams with the dot size of 0.01 μm, for example. Because the spherical abberation and chromatic aberration of the final lens of the electron beam exposure apparatus can only be suppressed to approximately 0.02 μm, the independent beams which are obtained via the blanking aperture array may make contact or overlap each other. As a result, the exposed and developed patterns will not include separated independent points.

It is, however, not easy to apply ON/OFF information to the blanking electrodes of 40,000 (200×200) apertures of the blanking aperture array. For example, apertures of 10 μm×10 μm are etched and formed with a pitch of 15 μm in a silicon (Si) substrate having a thickness of 30 μm, and a thin oxide layer in the order of 3000 Å is formed on the surface of the Si substrate. When a tungsten (W) layer is formed on the two mutually confronting surfaces in each aperture so as to form the blanking electrodes, a lattice portion having a width of 5 μm is formed on the Si substrate. Metal interconnection patterns must be formed on this lattice portion which has the width of 5 μm, so that an electrical signal can be applied independently to the blanking electrodes of each of the apertures. In this case, it is necessary to form at least 100 interconnection patterns in each horizontal line of the lattice portion, assuming that the interconnection patterns are formed independently from the two sides of the Si substrate for the right and left sides. In order to form a line-and-space pattern within the width of 5 μm with one interconnection level, it becomes necessary to form a line-and-space pattern of 0.025 μm at the most packed part of the interconnection but such a fine line-and-space pattern cannot be realized at the present. Even when the multi-level interconnection is employed, it is still necessary to form a line-and-space pattern of 0.25 μm when ten interconnection levels are used. Although the line-and-space pattern of 0.25 μm can be realized technically, it is unrealistic at the present to provide ten interconnection levels.

The blanking aperture array also suffers from the following difficulties. That is, the blanking aperture array is normally set in a vacuum called a column within the electron beam exposure apparatus, however, it is virtually impossible to connect 40,000 signal lines into the column when taking into account the signal transmission lines, the IC for sending the signals and the hermetic sealing for the vacuum. Accordingly, the two-dimensional blanking aperture array is impractical when the extremely large number of interconnections are to be formed for the purpose of independently supplying the ON/OFF information to the blanking electrodes of each of the apertures.

Furthermore, the blanking aperture array also introduces problems in beam correction. When correcting the irregular intensity at each cross section of the beam incident to the blanking aperture array, that is, when correcting the non-uniformity of the intensity distribution of the crossover image, the ON time of each aperture is corrected accordingly. However, in the case of an n×m two-dimensional blanking aperture array having an extremely large number of apertures, a correction circuit for correcting the ON information to be supplied to each of the apertures becomes complex and large scale.

On the other hand, when the patterns become extremely fine, the thickening/thinning of the patterns due to proximity of adjacent patterns becomes conspicuous. The proposed exposure apparatus, however, does not have a means for correcting the proximity.

An exposure apparatus which uses the two-dimensional blanking aperture array of the type described above is proposed in a Japanese Laid-Open Utility Model Application No. 56-19402. This proposed exposure apparatus employs an aperture array which is made up of a plurality of gate plates so as to distribute the interconnections to the blanking electrodes over the plurality of gate plates. However, the interconnections to the blanking electrodes are still complex because the number of interconnections as a whole is not reduced. In addition, it is extremely difficult to position the corresponding blanking electrodes between the gate plates.

On the other hand, a one-dimensional blanking aperture array having a single row of apertures eliminates the above described problems related to the interconnections. For this reason, the one-dimensional blanking aperture array can be produced by simple production steps. However, the throughput of the one-dimensional blanking aperture array is small, and it is impossible to satisfy the demands of IC production such as drawing 1 $cm^2$ on the wafer in 1 second.

SUMMARY OF THE INVENTION

Accordingly, it is a general object of the present invention to provide a novel and useful blanking aperture array, a method of producing a blanking aperture array, a charged particle beam exposure apparatus and a charged particle beam exposure method in which the problems described above are eliminated.

Another and more specific object of the present invention is to provide a blanking aperture array for use in a charged particle beam exposure comprising a substrate, at least m rows by n columns of apertures arranged two-dimensionally in the substrate, each of the apertures having a pair of blanking electrodes, where m and n are integers greater than one, and n m-bit shift registers provided on the substrate for applying voltages dependent on pattern data to the blanking electrodes of the apertures, the pattern data being related to a pattern which is to be exposed using the blanking aperture array. According to the blanking aperture array of the present invention, it is possible to improve the fineness of the pattern, the positioning accuracy, the quick turnaround, the control and the reliability of the exposure which uses a charged particle beam.

Still another object of the present invention is to provide a method of producing a blanking aperture array comprising the steps of preparing a stacked structure including a semiconductor substrate, an impurity diffusion layer formed on a top surface of the semiconductor substrate and an epitaxial layer formed on the impurity diffusion layer, forming a plurality of shift registers generally along a first direction and clock signal lines generally along a second direction on the epitaxial layer, each of the shift registers comprising a plurality of shift register parts which are coupled in series, each shift register part including an inverter and a gate, the clock signal lines being coupled to the gates of the shift register part, the first and second directions being mutually perpendicular, forming rows and columns of apertures between the shift registers and the clock signal lines, each of the apertures having a pair of blanking electrodes, the rows extending in the first direction, the columns extending in the second direction, and connecting one of the pair of blanking electrodes of each aperture to an output of a corresponding one of the shift register parts and the other of the pair of blanking electrodes of each aperture to a potential line.

A further object of the present invention is to provide a charged particle beam exposure apparatus comprising a blanking aperture array which has a substrate and m rows and n columns of apertures arranged two-dimensionally in the substrate, each of the apertures having a pair of blanking electrodes, voltage applying means for applying to the blanking electrodes of each of the apertures a voltage dependent on a pattern data which describes a pattern which is to be exposed so that a charged particle beam transmitted through the apertures is turned ON/OFF depending on the applied voltage, and a stage which carries an object on which the pattern is exposed by the charged particle beam transmitted through the apertures, where the voltage applying means includes n m-bit shift registers which are formed on the substrate of the blanking aperture array, and the n shift registers apply to the blanking electrodes of each of the apertures the voltage dependent on the pattern data which describes the pattern which is to be exposed on the object.

Another object of the present invention is to provide a charged particle beam exposure apparatus comprising a stage on which an object is placed, charged particle beam generating means including m rows by n columns of variable control charged particle beam generating elements for generating a charged particle beam corresponding to each of a pattern which is to be exposed on the object, n m-bit shift registers provided along each row of the charged particle beam generating elements for applying a voltage dependent on a pattern data to each of the charged particle beam generating elements, the pattern data describing the pattern which is to be exposed on the object, a buffer for supplying the pattern data to the n shift registers, and deflecting and converging means for projecting the charged particle beam from the charged particle beam generating means on the object.

Still another object of the present invention is to provide a charged particle beam exposure method for exposing an object in a charged particle beam exposure apparatus which comprises a stage on which the object is placed, charged particle beam generating means including m rows by n columns of variable control charged particle beam generating elements for generating a charged particle beam corresponding to each of a pattern which is to be exposed on the object, n m-bit shift registers provided along each row of the charged particle beam generating elements for applying a voltage dependent on a pattern data to each of the charged particle beam generating elements, the pattern data describing the pattern which is to be exposed on the object, a buffer for supplying the pattern data to the n shift registers, and deflecting and converging means for projecting the charged particle beam from the charged particle beam generating means on the object, where the charged particle beam exposure method comprises the steps of successively inputting the pattern data to the n shift registers from the buffer n bits at a time along the column direction, simultaneously shifting the pattern data in the n shift registers in response to a clock, and controlling a movement of the stage and the deflecting and converging means so that the charged particle beam which is selected and patterned by the charged particle beam generating means is projected at the same position on the object.

Other objects and further features of the present invention will be apparent from the following detailed description when read in conjunction with the accompanying drawings.

BRIEF DESCRIPTION OF THE DRAWINGS

FIG. 3 is a system block diagram for explaining an operating principle of the present invention;

FIGS. 16(A) through 16(N) are timing charts for explaining the shift operation of the fifth embodiment;

FIG. 17A is a cross sectional view of the aperture array;

FIGS. 17B and 17C are cross sectional views of the aperture array shown in FIG. 17A on an enlarged scale;

FIG. 17D is a plan view of the aperture array shown in FIG. 17A on an enlarged scale;

DESCRIPTION OF THE PREFERRED EMBODIMENTS

Figure 1A:
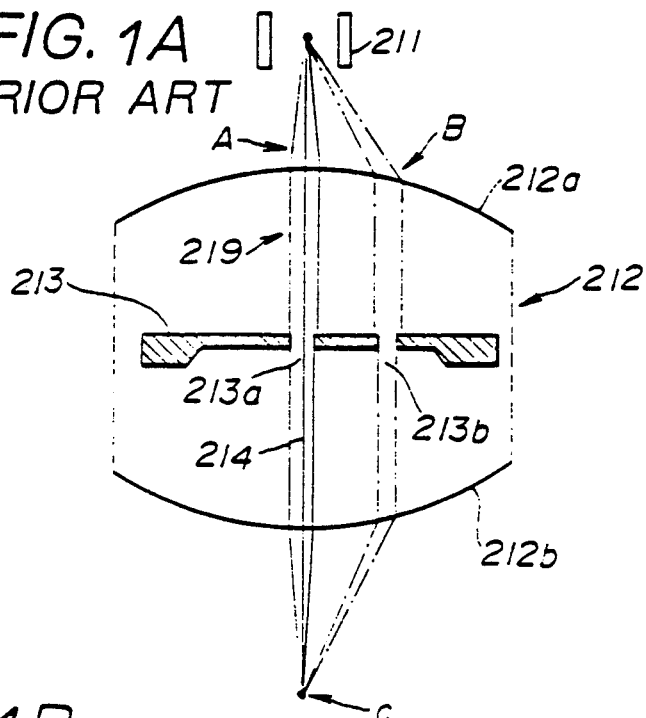
FIG. 1A is a cross sectional view showing an essential part of a conventional stencil mask type exposure apparatus.
Figure 1B:
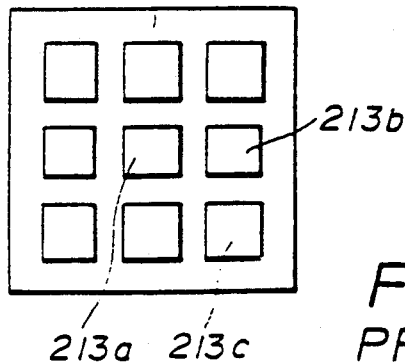
FIG. 1B is a plan view showing a stencil mask used on the exposure apparatus shown in FIG. 1A.
Figure 1C:
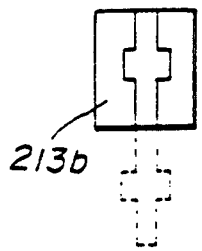
FIGS. 1C and 1D are plan views respectively showing examples of patterns.
Figure 1D:
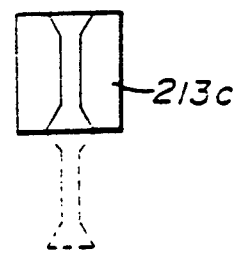
Figure 2:
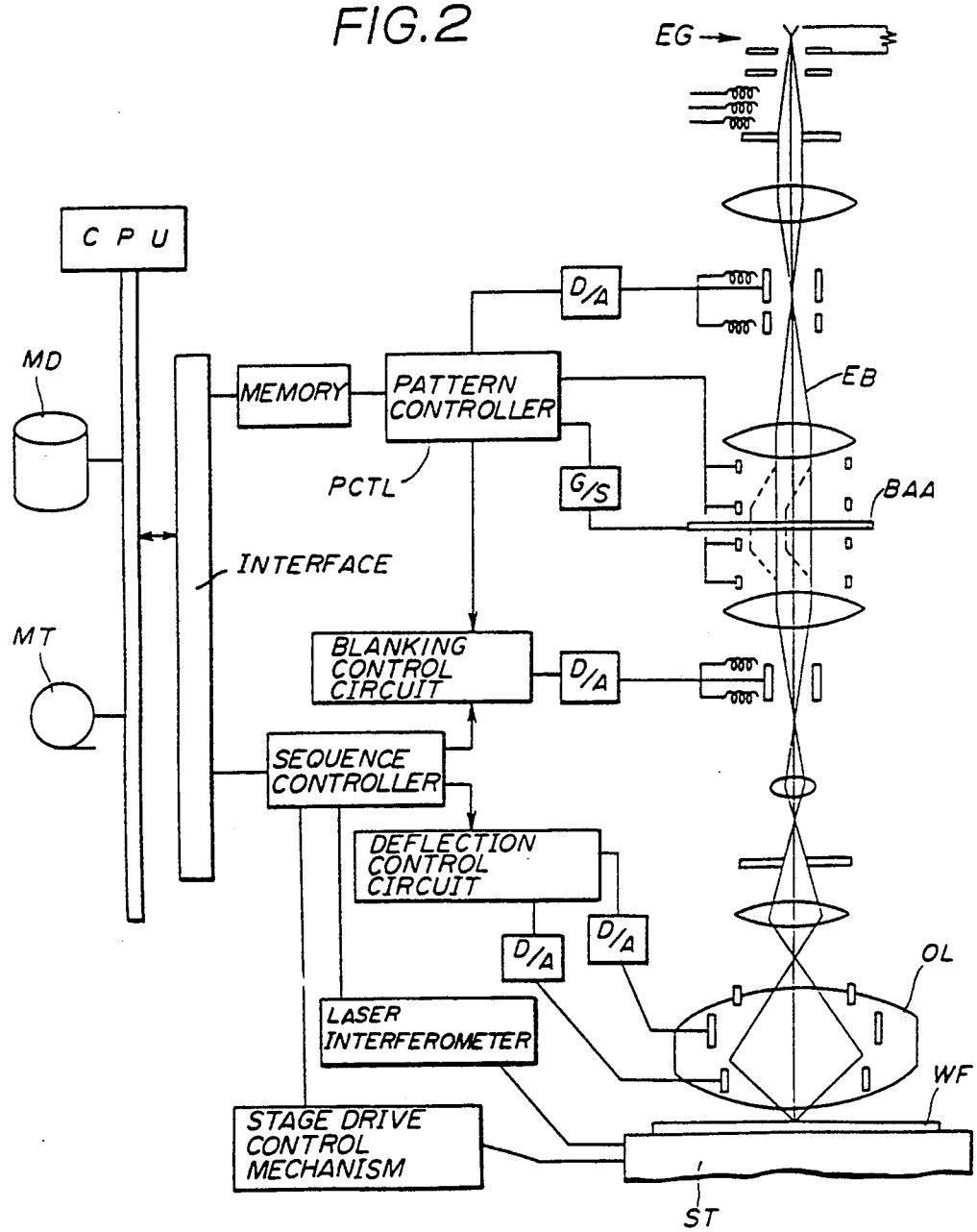
FIG. 2 is a system block diagram generally showing a conventional electron beam exposure apparatus.

First, a description will be given of an oeprating principle of the present invention. In the present invention, a two-dimensional blanking aperture array 1 shown in FIG. 3 is used to form the cross sectional shape of the charged particle beam into a desired pattern. The blanking aperture array 1 includes a plurality of apertures 2 which are arranged in a matrix arrangement. Each aperture 2 has a pair of blanking electrodes $3a$ and $3b$. The beam which is transmitted through the aperture 2 is deflected or not deflected depending on ON/OFF information which is supplied to the blanking electrodes $3a$ and $3b$. The beam is or is not projected on a wafer which is to be exposed depending on the deflection/non-deflection of the beam transmitted through the aperture 2.

A voltage which is applied to each blanking electrode is determined according to the desired pattern into which the cross section of the beam is to be shaped. A pattern generator 4 generates the desired pattern, and each driving mechanism 5 supplies ON/OFF voltages to the blanking electrodes depending on the desired pattern. The driving mechanism 5 includes a shift register and an electrode driver which is controlled by the shift register. A pattern data transfer circuit 6 transfers the pattern data from the pattern generator 4 to the driving mechanisms 5.

A beam shaping part 7 shown in FIG. 3 functions as a variable stencil which describes the desired exposure pattern by a group of dots. The patern generator 4 decomposes the desired exposure pattern in a rectangular region which is occupied by a group of the apertures 2 into dots corresponding to the apertures 2, and generates the dot pattern data. Out of the dot pattern data generated from the pattern generator 4, the pattern data transfer circuit 6 supplies to each driving mechanism 5 the data portion related to each row. Out of the data portion related to each row, the data portion related to each column is supplied to a corresponding one of the apertures 2. As a result, each aperture 2 is turned ON/OFF depending on the dot pattern data, and a pattern formed by the ON apertures 2 matches the desired exposure pattern.

Specifically, the driving mechanism 5 includes a shift register and a driver which receives each bit of data from the shift register and drives the blanking electrodes $3a$ and $3b$ of the apertures 2. The pattern generator 4 may be constituted by a CPU. The pattern data transfer circuit 6 is a buffer means for distributing the 8-bit or 16-bit parallel dot pattern data from the pattern generator 4 to each row of the driving mechanisms 5 in the blanking aperture array 1.

Because the beam shaping part 7 functions as the variable stencil, the exposure speed of the exposure using this beam shaping part 7 is improved. In addition, the cross sectional shape of the beam changes depending on the pattern data, and there is no need to prepare a number of different stencils and carry out the troublesome operation of changing the stencils depending on the patterns to be exposed. As a result, the throughput is improve by the use of the beam shaping part 7. Furthermore, the driving mechanism 5 includes the shift register and there is no need to provide the interconnections for independently turning ON/OFF the apertures 2. Therefore, the blanking aperture array 1 can be produced with ease.

Next, a description will be given of a first embodiment of the blanking aperture array according to the present invention and an embodiment of a charged particle beam exposure method which employs this first embodiment of the blanking aperture array.

Figure 4A:
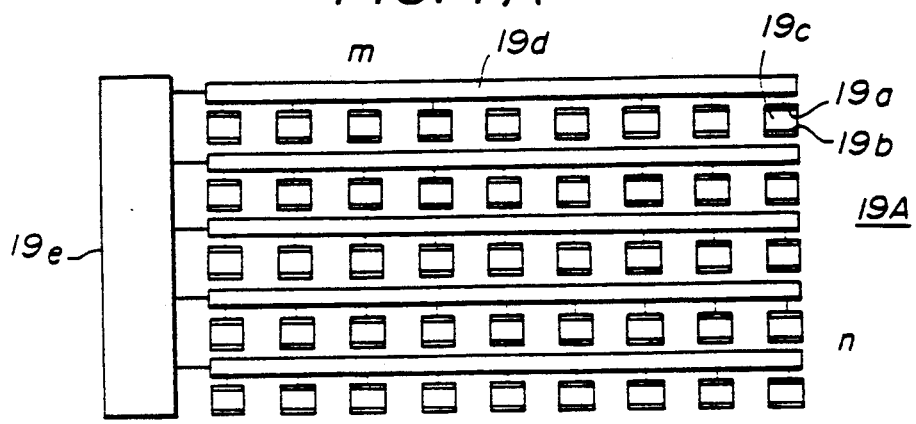
FIG. 4A is a system block diagram showing a first embodiment of a blanking aperture array according to the present invention.

In this embodiment, a blanking aperture array 19A has apertures 19c arranged two-dimensionally in an m row by n column matrix arrangement as shown in FIG. 4A. Each aperture 19c has a pair of blanking electrodes 19a and 19b. An m-bit shift register 19d is provided along each row of the apertures 19c. A buffer 19e supplies the pattern data to each of the n shift registers 19d.

The pattern data of the figure which is to be exposed is supplied to the buffer 19e. The figure which is to be exposed is sectioned into rows and columns and the pattern data describes a dot pattern with n bits for each column. For example, when the figure which is to be exposed is sectioned in conformance with the blanking aperture array 19A and each pattern region corresponding to one aperture 19c is sectioned into m rows by n columns, the pattern data is supplied to the buffer 19e in a sequence of the n bits of the first column, the n bits of the second column, ..., and the n bits of the mth column. When the buffer 19e is made up of a FIFO buffer which is capable of making an n bit parallel output, the data is supplied simultaneously to each of the n shift registers 19d in the sequence of the n bits of the first column, the n bits of the second column, ..., and the n bits of the mth column. The shift register 19d successively shifts the received bits in response to a clock signal.

The data supplied to the buffer 19e may include correction data in addition to the pattern data which is related to the figure to be exposed. The correction data is used to correct the non-uniformity of the beam intensity distribution by extending the exposure time where necessary. It is also possible to correct the non-uniformity of the beam intensity distribution by shortening the exposure time, that is, by reducing the exposure for the pattern data beforehand. The proximity can be corrected by correcting (thinning or thickening) the pattern data or adjusting the exposure.

Figure 4B:
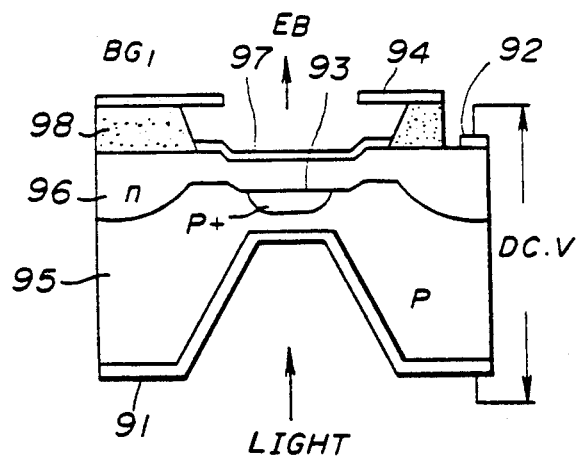
FIGS. 4B and 4C are cross sectional views respectively showing structures for controlling beam generation.
Figure 4C:
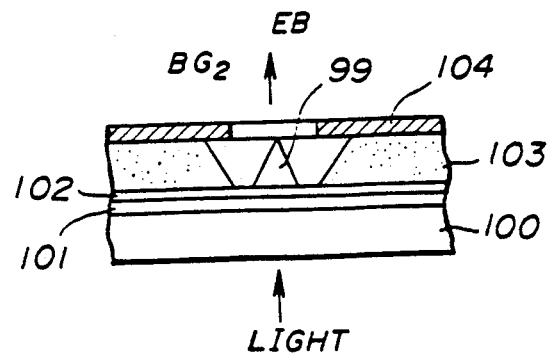

A beam which is projected on the blanking aperture array 19A shown in FIG. 4A has a cross section greater than the entire area of the blanking aperture array 19A. The beam is patterned by the deflection/non-deflection of each of the blanking electrodes 19a and 19b. This patterning of the beam can be carried out by controlling the generation of the beam itself. FIGS. 4B and 4C show such examples of beam generation control. FIGS. 4B and 4C respectively correspond to one aperture 19c, and such apertures 19c are arranged in the m row by n column matrix arrangement within the blanking aperture array 19A.

In FIG. 4B, a transparent electrode 91 is formed on a p-type Si substrate 95. An electrode 92 is formed on an n-type layer 96. A D.C. voltage DC.V is applied across the electrodes 91 and 92 depending on the pattern data. A pn junction 93 is formed at an interface between the p-type and n-type layers 95 and 96, and a thin film 97 for reducing the work function is formed on the n-type layer 96. An insulator layer 98 is formed on the n-type layer 96 as shown, and an acceleration electrode 94 is formed on the insulator layer 98. When a laser beam is received by this structure shown in FIG. 4B in a state where a voltage is applied across the electrodes 91 and 92, hot electrons are generated by avalanche and the electron beam EB is output.

In FIG. 4C, the structure is provided with a conical cathode 99, an anode electrode 104, a light transmitting substrate 100, a light transmitting conductor 101, a photoconductive layer 102, and an insulator layer 103. When a voltage is applied to the light transmitting conductor 101 and a light is received by this structure, electrons are emitted from the cathode 99 and the electron beam EB is output.

In the structures shown in FIGS. 4B and 4C, it is possible to control the electron beam EB and generate a patterned two-dimensional electron beam by controlling the applied voltage to the electrode and controlling the light emittance of a light emitting diode (LED) or the like.

Next, a description will be given of the embodiment of the charged particle beam exposure method which uses the blanking aperture array 19A shown in FIG. 4A, by referring to FIGS. 5A through 5F.

Figure 5A:
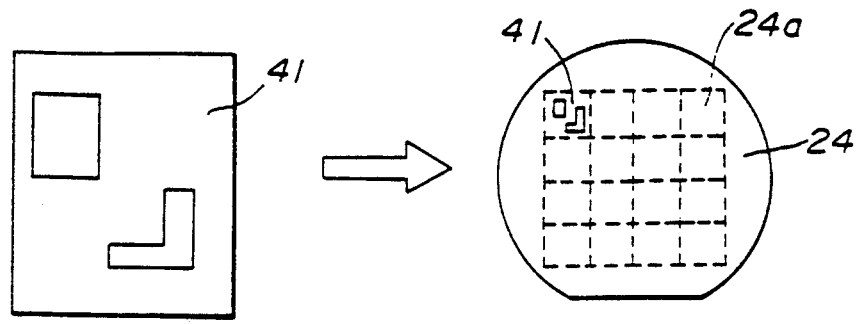
FIGS. 5A through 5F are diagrams for explaining an embodiment of a charged particle beam exposure method according to the present invention which employs the blanking aperture array shown in FIG. 4A.
Figure 5B:
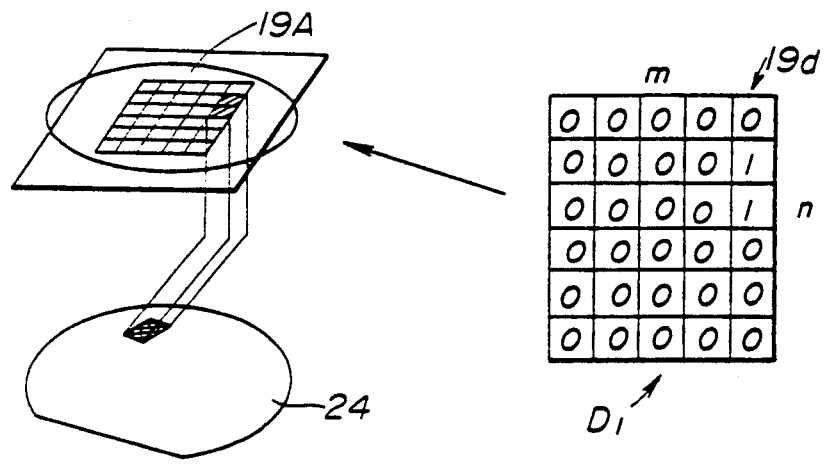
Figure 5C:
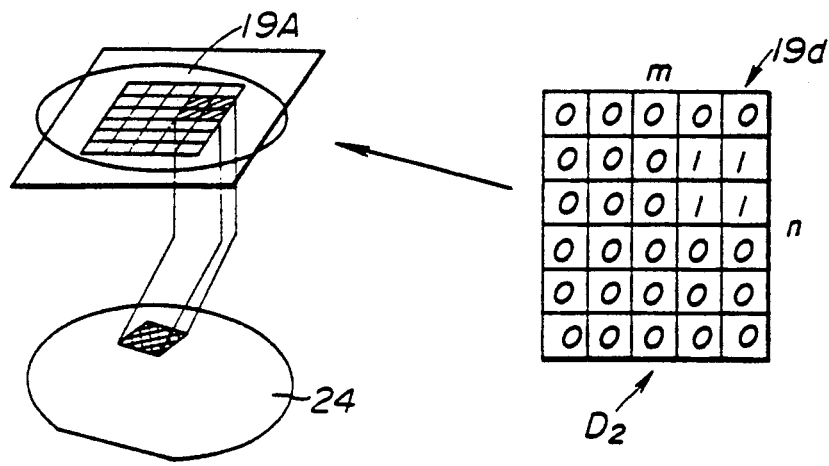
Figure 5D:
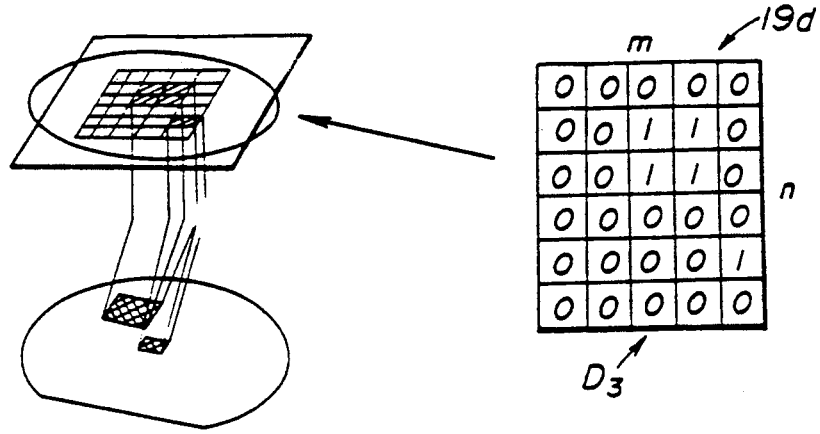
Figure 5E:
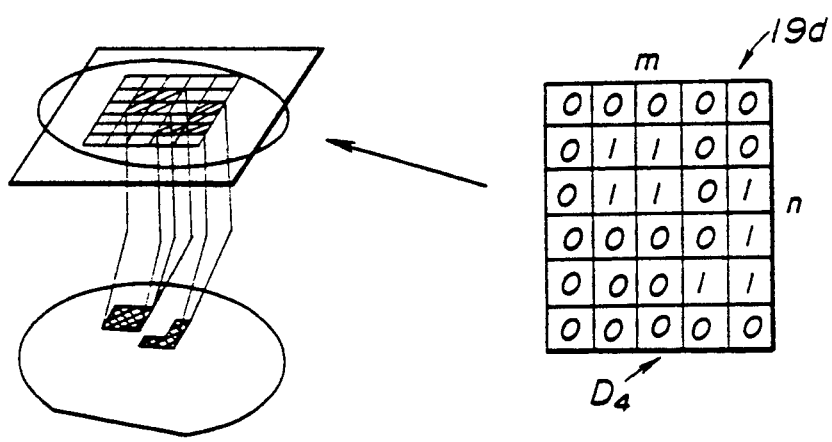
Figure 5F:
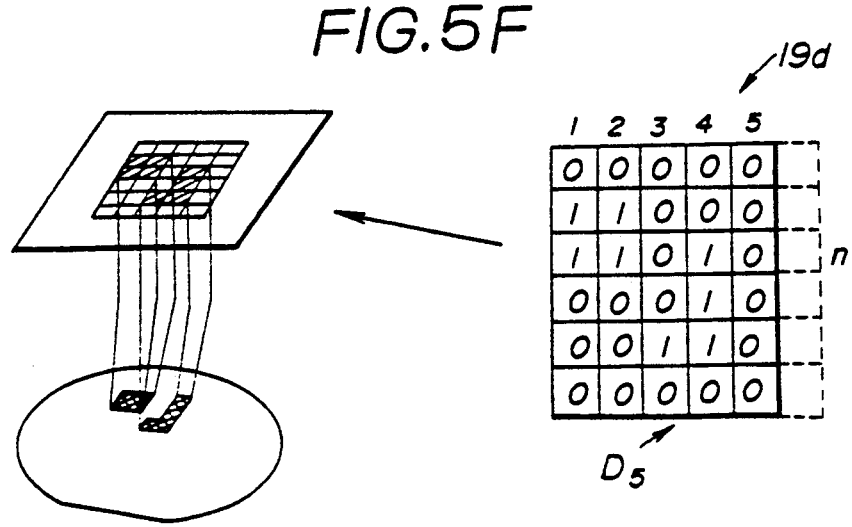

It is assumed for the sake of convenience that a plurality of chips 24a are to be formed on a wafer 24, and a pattern 41 is to be exposed for each chip 24a. This pattern 41 is sectioned into m rows by n columns, and a position (pixel or dot) where the pattern (figure) exists is indicated by a data "1" and a position where no pattern exists is indicated by a data "0". As a result, a pattern data D5 which is related to the pattern to be exposed becomes as shown in FIG. 5F. The pattern data related to the first, second, ... columns are successively supplied to the buffer 19e, and the buffer 19e successively supplies the pattern data related to the first, second, ... columns to the n shift registers 19d. Each shift register 19d shifts the received data in response to a shift clock. Hence, for the pattern data related to the first column, the data in the shift register 19d becomes as shown in FIG. 5B and only the electron beam which passes those apertures 19c which receive the data "1" is projected at a predetermined position on the wafer 24. When the pattern data related to the second column is received by the buffer 19e, the data in the shift register 19d becomes as shown in FIG. 5C. When the pattern data related to the third and subsequent columns are received by the buffer 19e, the data in the shift register 19d successively becomes as shown in FIGS. 5D through 5F.

As described above, the pattern data successively shifts in the blanking aperture array 19A similarly to a talking sign or talking-news, for example. For this reason, the position on the wafer 24 where the beam hits changes if no measures are taken with respect to the beam. However, in this embodiment, the position on the wafer 24 where beam hits is not changed, but instead, the beam hits the same position on the wafer 24 until the desired exposure time is reached. This is achieved by deflecting the beam. The deflection of the beam is controlled by taking into account the movement of the wafer 24 when the stage moves. If the moving direction of the stage (wafer 24) and the beam deflection direction are the same, the correction quantity by the deflection can be small and in some cases it may be sufficient to simply move the stage along.

The data related to the first column appears first and the data related to the mth column appears last. This means that the exposure time of each column becomes different, but the exposure time can be made the same by making the data related to the first column disappear first and the data related to the mth column disappear last.

The exposure time is the time for which the data "1" appears on the blanking aperture array 19A, and may be described as (the number of apertures 19c which receive the data "1")×(the clock period). This definition of the exposure time can be effectively used to correct the exposure time. That is, when the beam intensity at a portion of the blanking aperture array 19A is low and the exposure time is to be extended at this portion, the number of effective apertures 19c is increased depending on the extension time. On the other hand, when the exposure time needs to be reduced, the exposure time as a whole is reduced and the number of effective apertures 19c is increased only at a portion where the exposure time is to be normal.

The number of effective apertures 19c can be controlled by inserting a gate circuit (not shown) between the blanking electrode and the shift register 19d for those apertures 19c which are controlled by the latter stage portion of the shift register 19d and providing an aperture array portion exclusively for the exposure time correction. In other words, the aperture array portion indicated by a phantom line in FIG. 5F is provided for the correction data in addition to the basic aperture array portion for the pattern data. On the other hand, when the number of effective apertures 19c is fixed and need not be controlled, it is unnecessary to add the gate circuit and it is simply sufficient to connect/disconnect the lines between the blanking electrodes and the shift registers 19d.

The pattern data is thinned or thickened in order to correct the proximity. Alternatively, a similar control is made with respect to the exposure.

According to this embodiment, the exposure is made by moving the two-dimensionally patterned beam while keeping the beam stationary on the wafer. For this reason, a large quantity of pattern data can be supplied efficiently to the blanking aperture array 19A or the charged particle beam generating means including the beam generating elements BG1 and BG2, and the exposure of fine patterns can be made at a high speed.

Of course, pattern data related to different figures may be successively supplied to the buffer 19e. When only the pattern data related to one figure is supplied to the buffer 19e, a dummy pattern data having the data "0" must be supplied to the buffer 19e so that the exposure time becomes the same at each position on the pattern. However, when the pattern data related to the different figures are successively supplied to the buffer 19e, there is no need to supply the dummy pattern data to the buffer 19e.

In addition, instead of carrying out the exposure while the pattern data is successively shifted in the shift register 19d, it is of course possible to carry out the exposure after the shift register 19d finishes the shift operation with respect to the pattern data related to one figure.

Figure 6:
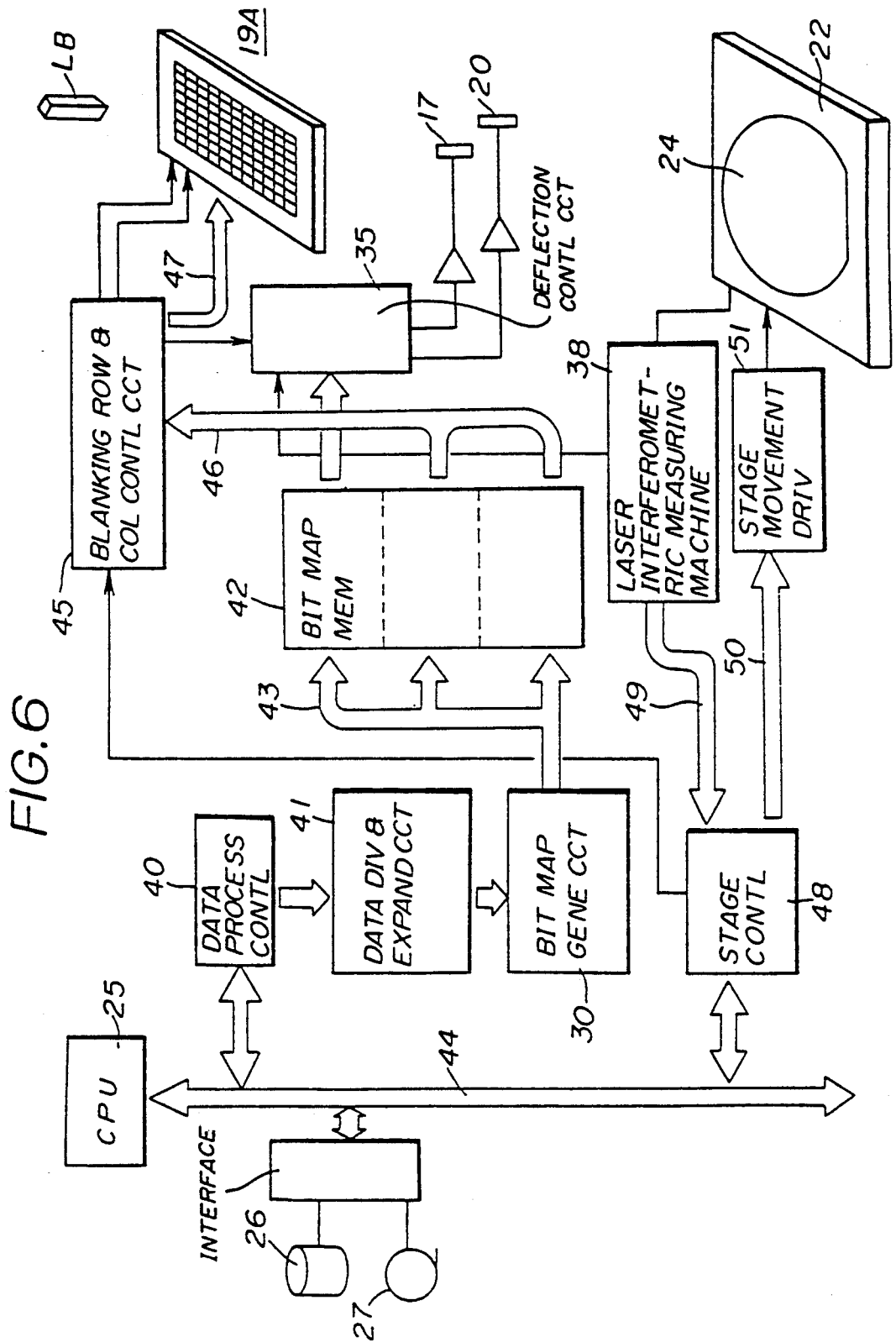
FIG. 6 is a system block diagram showing an embodiment of a charged particle beam exposure apparatus according to the present invention.
Figure 7:
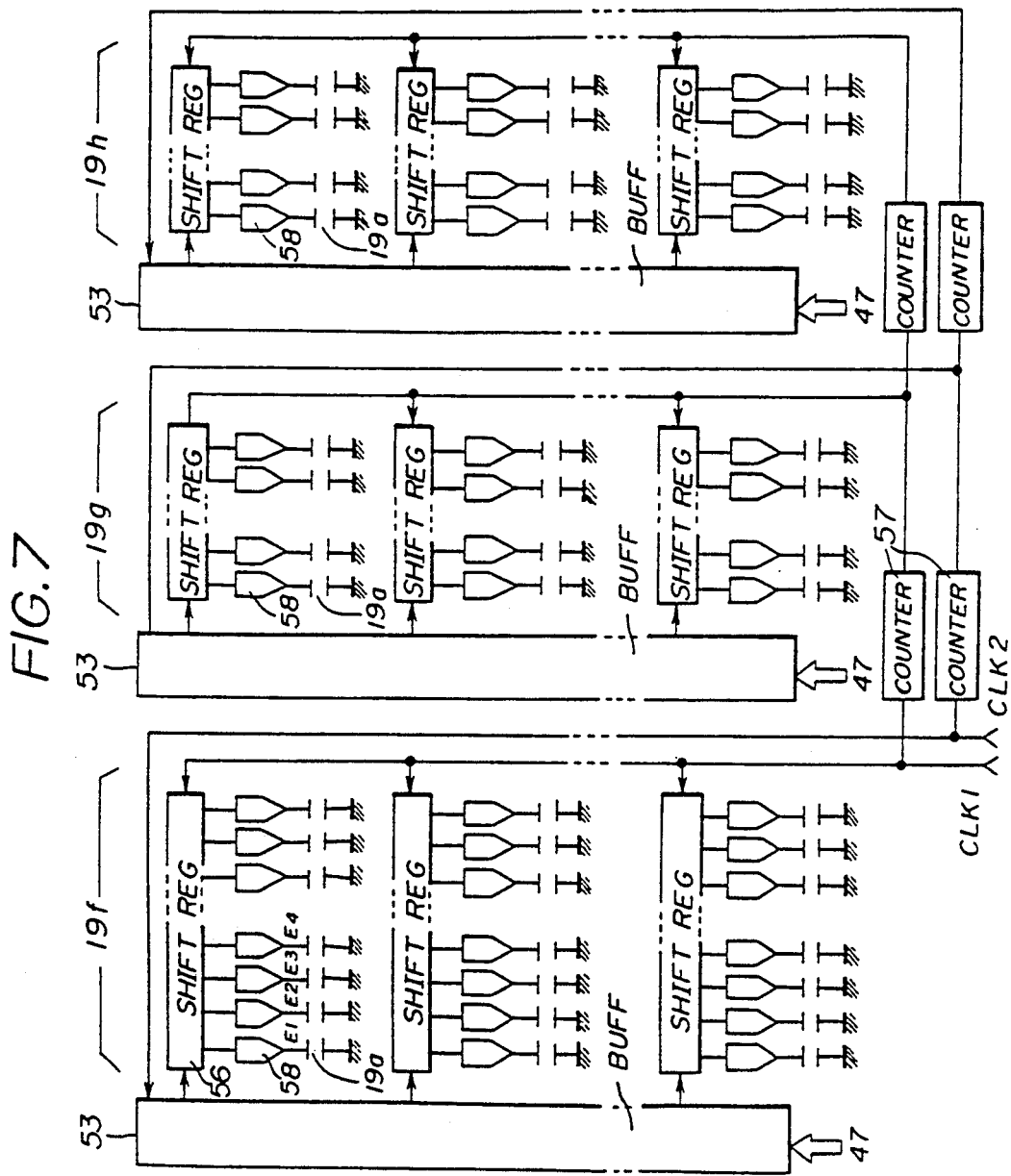
FIG. 7 is a system block diagram showing a driving part of the blanking aperture array shown in FIG. 6.

FIGS. 6 and 7 show an embodiment of a charged particle beam exposure apparatus according to the present invention. FIG. 6 is a system block diagram of the charged particle beam exposure apparatus. In FIG. 6, a processor 25 reads a drawing data from a magnetic disk 26 or a magnetic tape 27. The drawing data is processed in the processor 25 and is supplied to a data processing controller 40. The data processing controller 40 supplies the processed data to a data division and expansion circuit 41 which analyzes the drawing data and restores compressed data. The data from the data division and expansion circuit 41 is supplied to a bit map generation circuit 30 which generates a figure from the data when the received data is a parameter which restricts the shape ad size of the figure. Further, the bit map generation circuit 30 divides the data into meshes having the blanking aperture size so as to obtain bit map data. The bit map data from the bit map generation circuit 30 is stored in a bit map memory 42 via a bit map data bus 43. The bit map generation circuit 30 also generates position data for controlling a horizontal scan deflector 17 and an 8-pole deflector 20, and these position data are also stored in the bit map memory 42.

Figure 8:
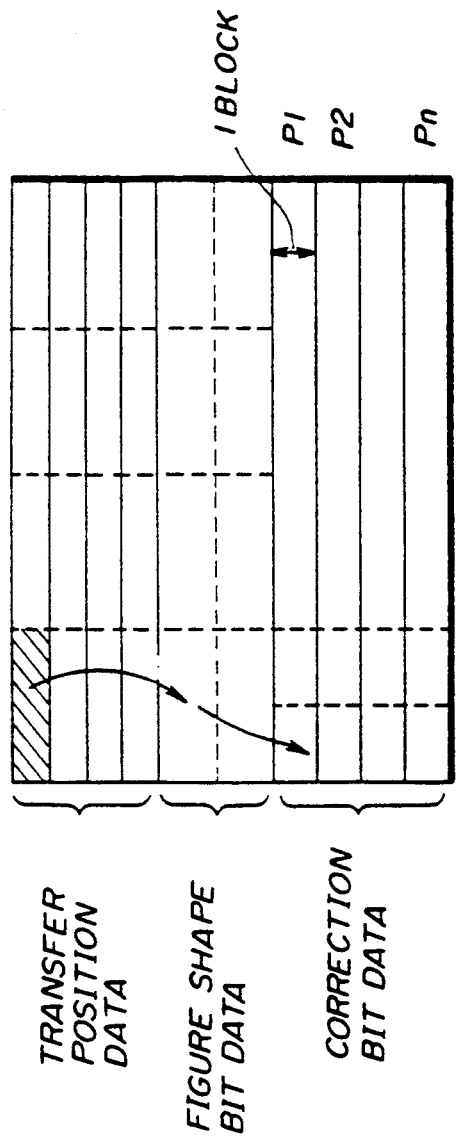
FIG. 8 is a diagram for explaining the structure of a bit map memory.
Figure 9:
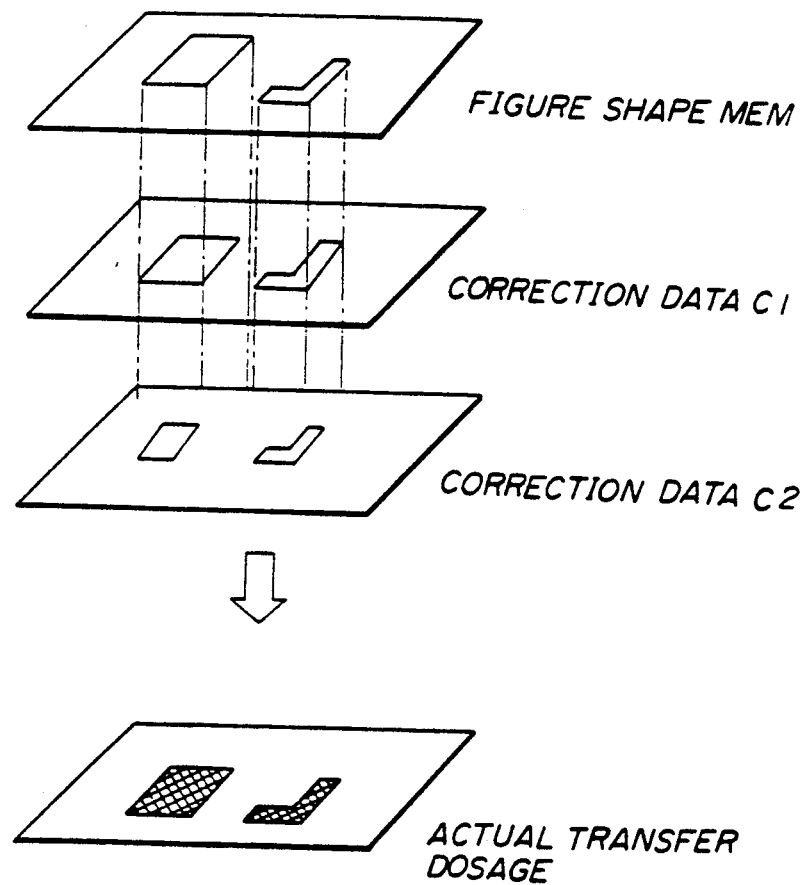
FIG. 9 is a diagram for explaining the exposure correction.

As shown in FIG. 8, the bit map memory 42 is roughly divided into three memory areas. The transfer position data describes the starting point of the figure bit data on the wafer, the designation information on the figure code and the like. The correction data includes data for correcting the non-uniformity of crossover image and data for correcting the proximity. When drawing the figure in this embodiment, the number of bit line columns determines the exposure dosage. Hence, in the memory area for storing the correction data, the correction data are stored as shown in FIG. 9 so that the exposure dosage is adjusted by an overlap. In FIG. 9, correction data C1 and C2 respectively are for correcting the non-uniformity of crossover image and for correcting the proximity.

Figure 10:
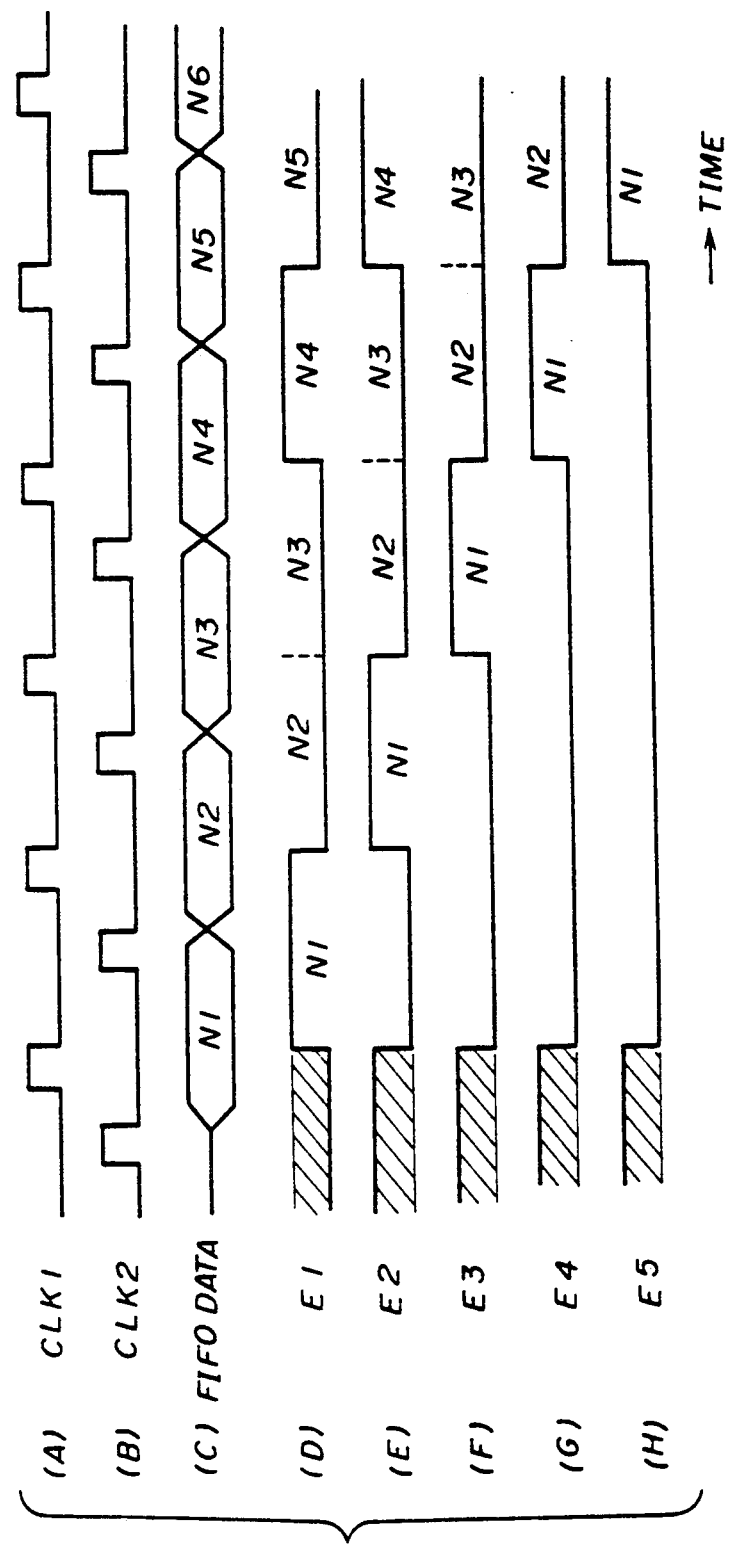
FIGS. 10A through 10(H) are timing charts for explaining the driving of blanking electrodes.

Based on the data stored in the bit map memory 42, a blanking row and column control circuit 45 controls the blanking aperture array 19A and a deflection control circuit 35. As shown in FIG. 7, the blanking aperture array 19A includes FIFO buffers 53, shift registers 56, and drivers 58 for driving the aperture electrodes 19a. The FIFO buffer 53 corresponds to the buffer 19e shown in FIG. 4A, and the shift register 56 corresponds to the shift register 19d shown in FIG. 4A. For example, the driver 58 includes transistors connected to form a Darlington pair. In FIG. 7, the blanking aperture array 19A includes an array portion 19f for the figure pattern, an array portion 19g for the correction data C1, and an array portion 19h for the correction data C2. The shift registers 56 and the FIFO buffers 53 are provided in each of the array portions 19f, 19g and 19h. The buffer 53 operates in response to a clock CLK2, and the shift register 56 operates in response to a clock CLK1. FIGS. 10(A) and 10(B) respectively show the clocks CLK1 and CLK2. FIG. 10(C) shows data N1, N2, ... which are successively supplied to the buffer 53 within the array portion 19f. FIGS. 10(D) through 10(H) respectively show the data which are supplied to blanking electrodes E1 through E5 in the array portion 19f.

The correction data is supplied to the array portions 19g and 19h of the blanking aperture array 19A for each block. The array portions 19g and 19h measure the end of the data movement in the array portion 19f by use of a clock counter circuit 57, and reads the data from the buffer 53 within the array portions 19g and 19h when the end is detected to turn ON/OFF the apertures of the array portions 19g and 19h. As a result, the correction shown in FIG. 9 is carried out.

The deflection control circuit 35 shown in FIG. 6 reads the transfer position data from the bit map memory 42 in synchronism with a signal from the bit map row and column control circuit 45, and drives the horizontal scan deflector 17 for deflecting a line beam LB. In addition, the stage 22 is subjected to a feedback control by a stage controller 48 and is moved continuously. This means that the position of the line beam LB must be corrected by a feedback control depending on the continuous movement of the stage 22. Thus, in this case, the deflection control circuit 35 reads the position of the stage 22 by a laser interferometric measuring machine 38 and obtains a difference between the present position data and the position data related to a previous transfer position. The deflection control circuit 35 controls the 8-pole deflector 20 so that the difference falls within a predetermined range.

Figure 11:
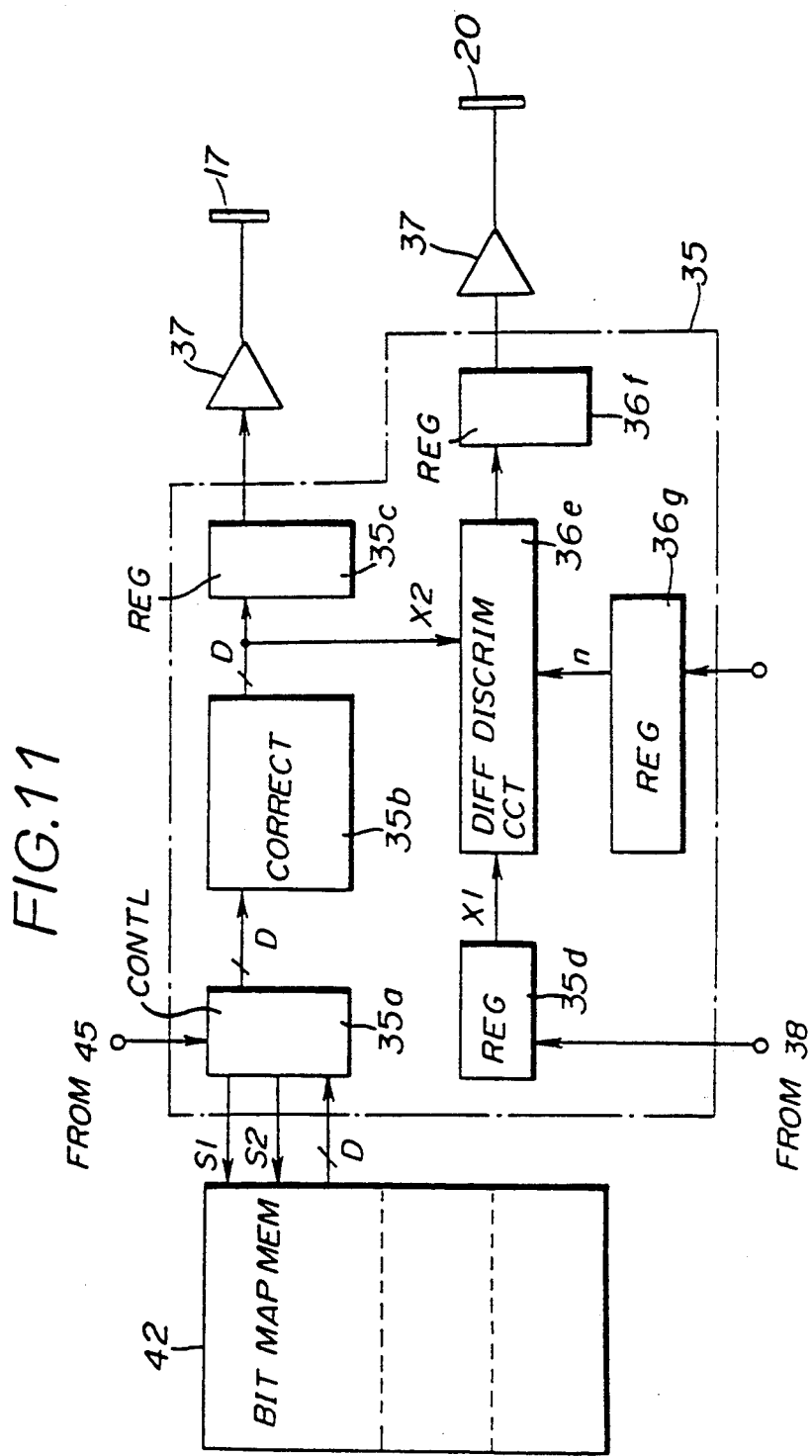
FIG. 11 is a system block diagram showing a deflection control circuit.

FIG. 11 shows the deflection control circuit 35 in more detail. A control part 35a receives a clock from the blanking row and column control circuit 45 and reads the data from the bit map memory 42. Si and S2 denote control signals such as read instructions and addresses supplied to the bit map memory 42, and D denotes the data read from the bit map memory 42. The data D which is read from the transfer position data storage area of the bit map memory 42 is supplied to a driver (DCA and AMP) of the horizontal scan deflector 17 via a correction circuit 35b and a register 35c. A stage position data X1 from the laser interferometric measuring machine 38 is set in a register 35d, and a difference discrimination circuit 36e discriminates whether or not the difference between this position data X1 and a position data X2 which is indicated by the data D is less than or equal to a value n which is set in a register 36g. In other words, the difference discrimination circuit 36e includes a CPU for discriminating whether or not $|X1-X2| < n$. The difference discrimination circuit 36e sets a predetermined value in a register 36f when the discrimination result is NO. This predetermined value is supplied to the 8-pole deflector 20 via a driver 37 so as to control the deflection of the line beam LB.

For example, it is assumed that the beam has the cross section of 0.05 $\mu$m×0.05 $\mu$m, 50 such beams are arranged in the column direction and 1000 such beams are arranged in the row direction, the resist has a current density of 200 A/cm$^2$ and a sensitivity of 5 $\mu$C/cm$^2$, and the exposure time for the area made up of the rows and columns is 25 ns. In this case, it is possible to obtain an exposure speed of 20 msec per 1 cm$^2$ when a scan area with a width of 2 mm is continuously moved at 50 mm/s. Therefore, it can be seen that this embodiment has 50 times the exposure speed of the conventional apparatus.

The driving circuit and the like may be similar to those described above when using the beam generating elements shown in FIGS. 4B and 4C.

A description will be given of a comparison of the conventional one-dimensional blanking aperture array and the two-dimensional blanking aperture array 19A. It is assumed for the sake of convenience that the aperture turns ON/OFF a beam which has a cross section of 0.01 $\mu$m×0.01 $\mu$m. A region of 1 cm$^2$ is described by $10^{12}$ such beams, and this region is exposed in 1 second. The resist has a sensitivity of 10 $\mu$C/cm$^2$. When the current density is 100 A/cm$^2$ and the exposure is made at 100 MHz, the number of beams (apertures) is $10^5$ and the line length is 1 mm. When the reduction factor is 1/100, there is a need to prepare a blanking aperture array of 100 mm×1 $\mu$m in the case of the one-dimensional blanking aperture array. However, it is extremely difficult to uniformly illuminate such a blanking aperture array, provide a suitable reduction optical system for the beam, or prepare $10^5$ signals at a high speed.

If only $10^3$ apertures can be prepared on the one-dimensional blanking aperture array, it will take 100 seconds to expose a region of 1 cm$^2$ and the exposure time is too long.

On the other hand, when the two-dimensional blanking aperture array 19A is used, it is possible to provide 100 columns and 1000 rows of apertures and shift the signals (bits) in each column in response to a clock which has a period of 1 ns, for example. Only an exposure time of 100 nm is required with the resist sensitivity of 10 $\mu$C/cm$^2$ and the current density of 100 A/cm$^2$. For this reason, a sufficient exposure is made on the resist while each signal passes 100 columns. When the reduction factor is 1/200, the size of the blanking aperture array becomes 200 $\mu$m×2 mm and it is sufficient to uniformly illuminate the surface of the blanking aperture array and make the appropriate reduction, thereby facilitating the production of the blanking aperture array. As for the signals, it is only necessary to transfer 1000 independent signals with the clock rate of 1 GHz which is feasible.

It is difficult and impractical to simultaneously transfer the pattern data to all of the apertures of the two-dimensional blanking aperture array from the point of view of the complex interconnections and driving circuits which will be required. On the other hand, it is too time consuming to transfer the pattern data one aperture at a time. But according to this embodiment which effectively utilizes the shift register, such problems are eliminated.

According to this embodiment, it is possible to correct the non-uniformity of the intensity distribution at the beam cross section and also correct the proximity. In addition, the circuit structure does not become complex due to the number of bits of the line beam. Therefore, a simple and efficient exposure is possible using the two-dimensionally patterned beam. A stable, high-speed and highly accurate exposure apparatus can thus be realized.

In FIG. 3, the beam shaping part 7 may be made up of a plurality of units, where each unit includes an array of the apertures 2 and the related driving mechanism 5. In this case, the units are switched and used one unit at a time. A description will now be given of a second embodiment of the blanking aperture array according to the present invention which has such units, by referring to FIG. 12.

Figure 12:
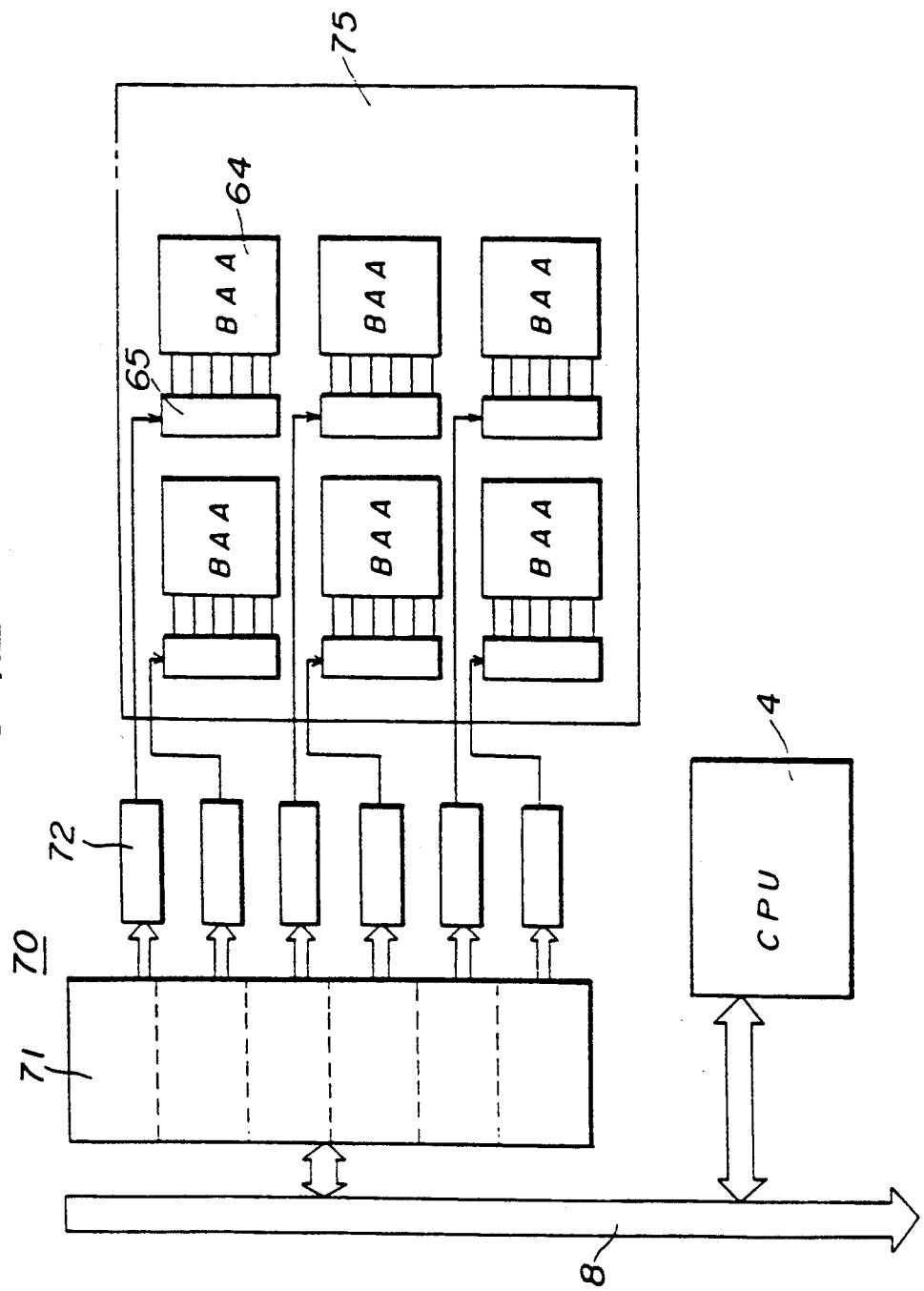
FIG. 12 is a system block diagram showing a second embodiment of the blanking aperture array according to the present invention.

In FIG. 12, the blanking aperture array includes a plurality of units 64 formed on a single mask (substrate) 75. A control circuit 65 is connected to each unit 64. A pattern data transfer circuit 70 includes a pattern memory 71 and a FIFO buffer 72 for each of the units 64. The pattern generator 4 is made up of a CPU and supplies the pattern data to the pattern memory 71 via a bus 8.

In FIG. 12, the plurality of units (BAAs) 64 are formed on the single mask 75. Hence, when a first BAA 64 is in used, it is possible to supply the next pattern data to a second BAA 64. In this case, it is possible to make the exposure using the second BAA 64 immediately after the exposure using the first BAA 64 is finished, and the throughput can be improved considerably.

The pattern memory 71 is divided into regions in correspondence with each of the BAAs 64, and the pattern generator 4 writes the dot pattern data for each of the BAAs 64 into the respective regions of the pattern memory 71. The transfer circuit 70 reads the dot pattern data from the pattern memory 71, and supplies the data to the driving mechanism of the BAA 64 via the FIFO buffer 72 and the control circuit 65. The blanking aperture array shown in FIG. 12 corresponds to a case where each stencil of a stencil mask is made up of the two-dimensional BAA 64.

In addition to the plurality of BAAs 64, it is possible to provide stencils and the like on the single mask (substrate) 75. A description will now be given of a third embodiment of the blanking aperture array according to the present invention which has such a structure, by referring to FIG. 13.

Figure 13:
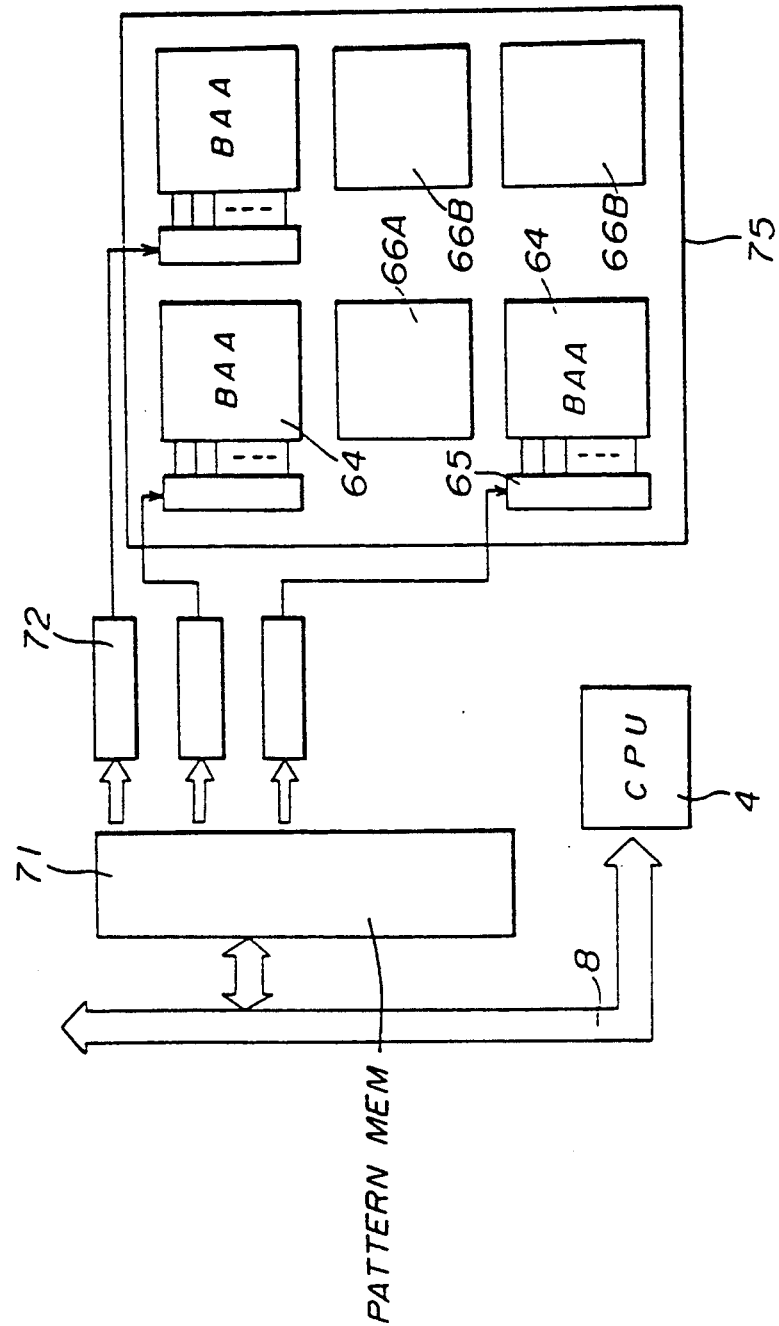
FIG. 13 is a system block diagram showing a third embodiment of the blanking aperture array according to the present invention.

As shown in FIG. 13, the blanking aperture array includes an aperture 66A for variable rectangular beam shaping and a stencil 66B. The stencil 66B is a cut pattern often seen in ICs and a plurality of such generally exist, but only two are shown in this embodiment for the sake of convenience.

In FIG. 13, the stencil 66B and the two-dimensional BAA 64 coexist on the single mask 75. It is more practical and simple to use the stencil 66B for those patterns which are used frequently. Generally, the stencil mask is also provided with the aperture for variable rectangular beam shaping. In this embodiment, a pattern having a relatively large line width can be exposed using the aperture 66A for the variable rectangular beam shaping, and the pattern data can be transferred to the BAA 64 during this exposure so that the beam shaping and exposure can next be made using the BAA 64. On the other hand, since no transfer of the pattern data is necessary for the stencil 66B, the mask 75 is effective in reducing the load on the CPU, that is, the pattern generator 4.

The mask 75 itself need not be one, and it is possible to provide a plurality of masks. A description will now be given of a fourth embodiment of the blanking aperture array according to the present invention which has such a structure, by referring to FIG. 14.

Figure 14:
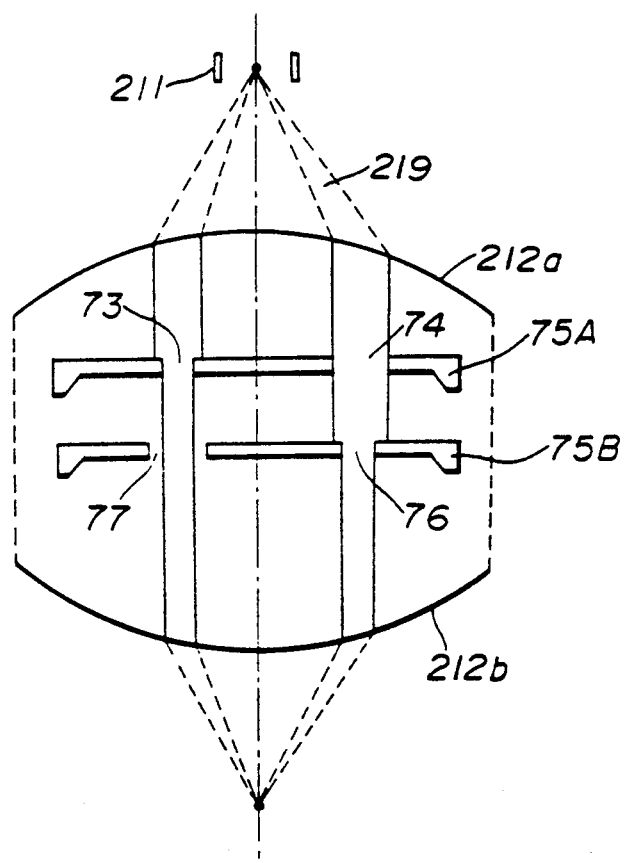
FIG. 14 is a cross sectional view for explaining a fourth embodiment of the blanking aperture array according to the present invention.

As shown in FIG. 14, this embodiment employs two masks 75A and 75B. In FIG. 14, those parts which are essentially the same as those corresponding parts in FIG. 1A are designated by the same reference numerals, and a description thereof will be omitted. The masks 75A and 75B are overlapped, and a beam shaping part of the lower mask 75B is simply used as an aperture when using a beam shaping part of the upper mask 75A, while a beam shaping part of the upper mask 75A is simply used as an aperture when using a beam shaping part of the lower mask 75B. In this embodiment, beam shaping parts 73 and 76 are in use, while simple rectangular apertures 74 and 77 do not carry out the beam shaping.

The structures of the stencil mask and the blanking aperture array mask greatly differ. When two masks are used as shown in FIG. 14 and one mask is used as the stencil mask while the other is used as the blanking aperture array mask, there are advantages from the point of view of the production steps required. In addition, the blanking aperture array mask has a large number of electronic circuits such as shift registers and drivers. When the structure shown in FIG. 14 is employed and some of the blanking apertures are made as simple apertures, it is advantageous in that a sufficient margin can be provided for the interconnections and the regions in which the elements are formed.

The stencil mask generally has stencils and variable rectangular beam shaping apertures, and it is simply necessary to additionally provide simple rectangular apertures in FIG. 14. When the two-dimensional blanking aperture array, the blanking rectangular apertures and the simple rectangular apertures are provided in the blanking aperture array mask shown in FIG. 14, it is possible to effectively utilize the two masks.

Figure 15:
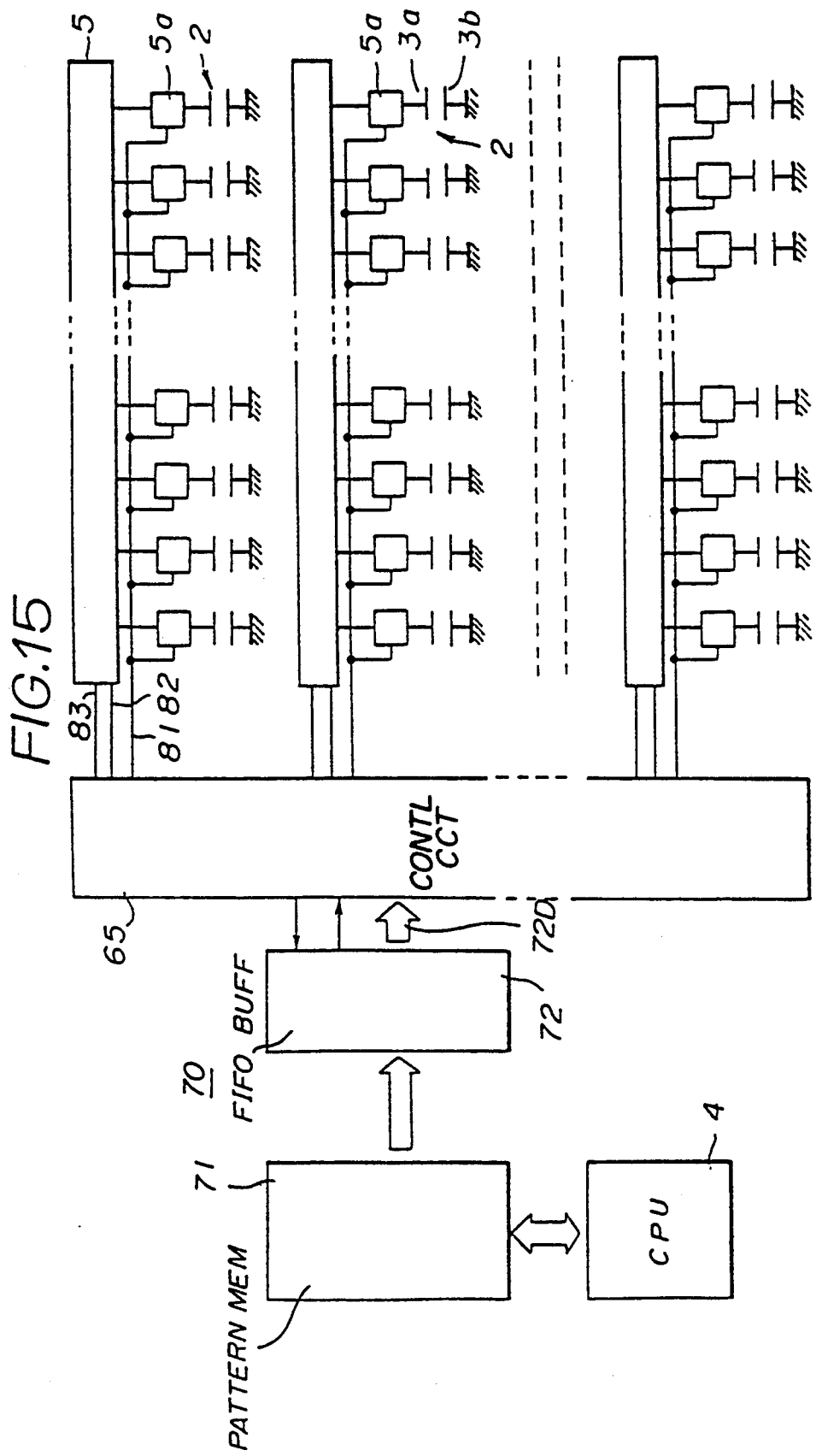
FIG. 15 is a system block diagram showing a fifth embodiment of the blanking aperture array according to the present invention.

Next, a description will be given of a fifth embodiment of the blanking aperture array according to the present invention, by referring to FIG. 15. In FIG. 15, those parts which are essentially the same as those corresponding parts in FIG.3 are designated by the same reference numerals. One blanking electrode $3b$ of the aperture 2 is grounded while the other blanking electrode $3a$ is connected to a driver $5a$ and receives a control voltage which carries out a deflection/non-deflection of the beam. An output control signal line 81, a shift clock line 82 and a serial data line 83 are provided as shown. The dot pattern data amounting to one row of the two-dimensional blanking aperture array is supplied to the shift register 5 via the serial data line 83, and the dot pattern data are shifted towards the end in response to a shift clock.

FIGS. 16(A) through 16(N) are timing charts for explaining the shift. An output data 72D of a FIFO buffer 72 shown in FIG. 16(B) changes to the next pattern data in accordance with the dot pattern data amounting to one row for every clock CLK amounting to one row shown in FIG. 16(A). The data A, B, ..., N related to each row are output in parallel as shown in FIGS. 16(C) through 16(N), and an output control signal 81A is received when the first through last data B0 through Bn are input to the shift register 5. Each bit of the shift register 5 is entered to the driver $5a$ and drives the blanking electrode $3a$. FIGS. 16(C) through 16(E) show the data B0 through Bn for the data A and FIG. 16(F) shows the corresponding output control signal 81A. FIGS. 16(G) through 16(I) shows the data B0 through Bn for the data B and FIG. 16(J) shows the corresponding output control signal 81A. FIGS. 16(K) through 16(M) show the data B0 through Bn for the data N and FIG. 16(N) shows the corresponding output control signal 81A.

Only one CPU 4 needs to be provided with respect to the plurality of two-dimensional blanking aperture arrays. The read out of data from a pattern memory 71 to the FIFO buffer 72 can be made by a direct memory access (DMA). The FIFO buffer 72 outputs the data in response to a request signal which is received from a control circuit 65. When a number of FIFO buffers 72 corresponding to the number of rows of the two-dimensional blanking aperture array are provided, it is simply necessary to supply the output data of each FIFO buffer 72 to the shift register 5 of each row. When one FIFO buffer 72 is provided in common to each of the rows, the read out data are distributed to each of the rows and the output speed is increased to L times the shift speed of each row, where L denotes the number of rows.

FIGS. 17A through 17D show an example of the blanking aperture array. FIG. 17A shows a cross section of the blanking aperture array, FIGS. 17B and 17C show the cross section on an enlarged view, and FIG. 17D shows a location (plan view) of the blanking aperture array. FIG. 17D shows the location (plan view) of the blanking aperture array, and FIG. 17B is the cross section along a line X-X in FIG. 17D while FIG. 17C is the cross section along a line Y-Y in FIG. 17D. As shown in FIG. 17A, the apertures 2 are formed in a silicon substrate 89 by an etching. As shown in FIG. 17B, the blanking electrodes 3a and 3b are formed on two confronting sides of the peripheral walls of the aperture 2. An electronic circuit 5A including the shift register, driver and the like and a related interconnection 5B are formed on the lower surface of the silicon substrate 89 as shown in FIG. 17C. The electron beam is output from the lower surface of the silicon substrate 89. Heavy metal layers 90a and 90b prevent the electron beam from entering the silicon substrate 89 and causing a potential change and undesirable effects on the electronic circuit 6A. Although not shown, the blanking electrode 3a which is connected to the driver is insulated by a $SiO_2$ layer or the like.

The shift register may have a known circuit structure. The number of interconnections can be reduced considerably when the shift register is used to supply the signal dependent on the pattern data to the blanking electrodes of the apertures within the row of the blanking aperture array. For example, when the number of apertures within one row is 256, 256 driving lines would be required according to the conventional method but it is simply necessary to provide one shift register according to this embodiment.

Figure 18A:
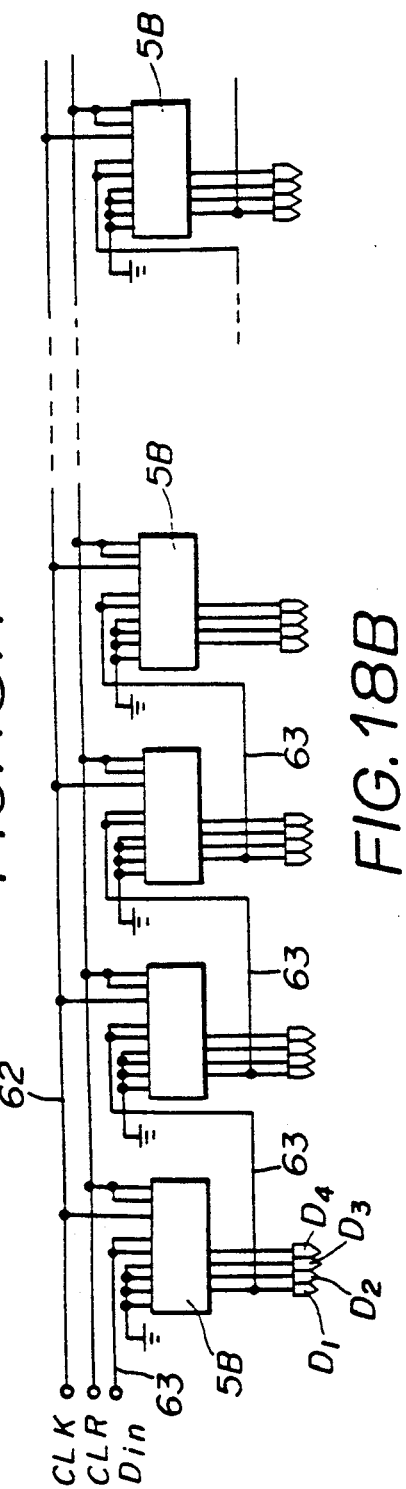
FIGS. 18A and 18B are a system block diagram and a plan view respectively showing an essential part of a sixth embodiment of the blanking aperture array according to the present invention.
Figure 18B:
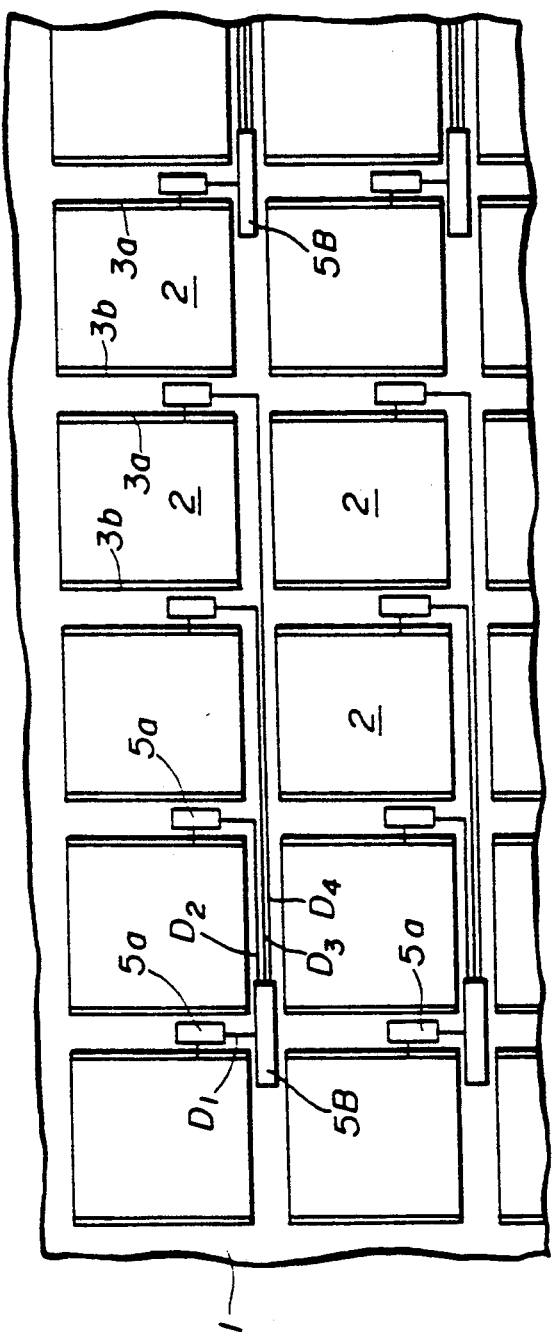

Next, a description will be given of a sixth embodiment of the blanking aperture array according to the present invention, by referring to FIGS. 18A and 18B. In this embodiment, the shift register 5 is made up of a plurality of 4-bit shift registers 5B which are connected in series. A TTL or ECL shift register No. 195on the market may be used as the shift register 5B. The shift registers 5B are coupled internally within the blanking aperture array or coupled externally to the blanking aperture array to form the shift register 5. The shift register 5B has output terminals D1 through D4, and terminals for receiving a clear signal CLR and a clock CLK. As shown in FIG. 18B which shows a plan view of a part of the blanking aperture array 1 on an enlarged scale, the shift register 5B is formed on the substrate between the apertures 2 for every four apertures 2 in the row direction. The driver formed on the substrate between the apertures 2 in the column direction. The drivers 5a each receive the signal from one of the output terminals D1 through D4 of the shift register 5B.

A description will be given of a numerical example for this embodiment. The aperture 2 has a rectangular shape with a side of 5 to 10 μm, and the apertures 2 are arranged with a pitch of 10 to 20 μm such that 30 to 50 apertures 2 are provided along the vertical and horizontal directions. In other words, 900 to 2500 apertures 2 are provided in total. When it is assumed that the aperture 2 has a side of 8 μm and the apertures 2 are arranged with a pitch of 10 μm, a band-shaped region having a width of 2 μm is formed between the apertures 2 in both the row and column directions. As shown in FIG. 18B, it is possible to form the shift register 5B and the driver 5a within the band-shaped region.

The shift register 5B requires power source lines, clock lines and signal lines, but the illustration of these lines is omitted in FIG. 18B for the sake of convenience. When each line has a width of 0.2 μm, it is possible to form five such lines within the band-shaped region which has the width of 2 μm and it is possible to form four lines within the band-shaped region when each line has a width of 0.25 μm. It is possible to accommodate a larger number of such lines when the multi-level interconnection is employed.

In the blanking aperture array which uses the shift register as in this embodiment, only one shift register is required for one row or column, and the production and control of the blanking aperture array is simple in that no address decode signal lines are required. In addition, when a plurality of variable stencils are provided on the mask and combined with a fixed stencil, it is possible to prepare for a next exposure during the exposure using one variable/fixed stencil by supplying the next pattern data to the other variable/fixed stencil, thereby improving the throughput. For example, when the blanking aperture array has 200×200 apertures with a side of 0.5 μm and a processing time of 1 ns is required to drive one set of shift register and blanking electrodes, the processing time as a whole is 200 ns but this processing time can be made substantially zero by carrying out this process during the exposure which uses another stencil. Furthermore, it is unnecessary to change the mask as in the case of the fixed stencil and the exposure time is effectively reduced by this embodiment. The degree of freedom with which the patterns may be designed is also improved.

Figure 19:
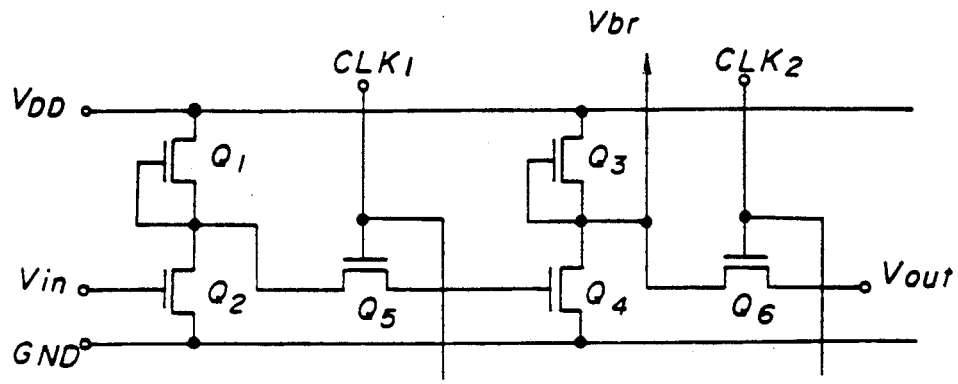
FIG. 19 is a circuit diagram showing an essential part of a seventh embodiment of the blanking aperture array according to the present invention.

Next, a description will be given of a seventh embodiment of the blanking aperture array according to the present invention, by referring to FIGS. 19 and 20. FIG. 19 shows a circuit diagram of the shift register which is used in this embodiment, and FIG. 20 shows the arrangement of the shift registers in the blanking aperture array BAA.

In FIG. 19, two inverters are coupled via a first gate to form a unit, and a plurality of such units are coupled via a second gate to constitute a shift register. Transistors Q1 and Q2 form a first inverter, transistors Q3 and Q4 form a second inverter, and transistors Q5 and Q6 respectively form first and second gates which are turned ON/OFF by respective first and second clocks CLK1 and CLK2. FIG. 19 shows one unit of the shift register, and 200 such units are connected in series to form one shift register in the two-dimensional blanking aperture array BAA which has 200×200 apertures. The number of shift registers provided in the blanking aperture array BAA is equal to the number of rows of apertures, and in this embodiment, 200 shift registers are provided.

Figure 20:
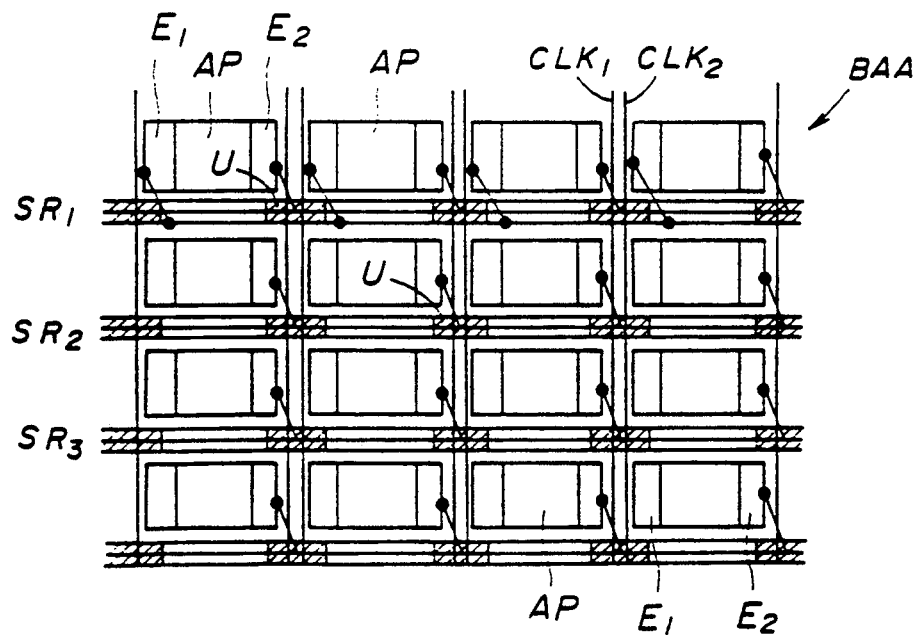
FIG. 20 is a plan view showing an essential part of the seventh embodiment.

In FIG. 20, SR1, SR2, ... denote the above described shift registers, and a hatched portion U indicates the above described unit. AP denotes the aperture of the blanking aperture array BAA, and the blanking aperture array BAA in this embodiment has 200×200 apertures AP. The shift registers SR1, SR2, ... are formed in the regions between the rows of apertures AP in the lattice arrangement and interconnections for the clocks CLK1 and CLK2 are formed in the regions between the columns of apertures AP.

Each aperture AP has a pair of electrodes E1 and E2. The electrode E1 is grounded or is connected to a power source potential $V_{DD}$, and the electrode E2 is applied with an output voltage Vbr of the corresponding unit of the shift register.

A description will be given of the operation of the shift register shown in FIG. 19. When a high-level signal is received as an input Vin, the first inverter (Q1 and Q2) outputs a low-level signal. The input Vin is received from a preceding stage (unit) when the clock CLK2 has a high level, and in this state, the clock CLK1 has a low level and the gate Q5 is OFF. Accordingly, a next stage (unit) receives via the gate Q6 a high/low-level output of the second inverter (Q3 and Q4) which is determined responsive to the previous input.

Next, when the clock CLK2 assumes the low level and the clock CLK1 assumes the high level, the first inverter (Q1 and Q2) outputs a low-level signal. This low-level signal is supplied to the second inverter (Q3 and Q4) via the gate Q5 and the second inverter (Q3 and Q4) outputs a high-level signal. However, the clock CLK2 remains low. Hence, the high-level signal output from the second inverter (Q3 and Q4) is not supplied to the next stage (unit) and is supplied thereto only in the next cycle when the clock CLK2 becomes high and the clock CLK1 becomes low. Similarly thereafter, the data input/output is controlled responsive to the clock CLK2 and the data shift is carried out within the unit in response to the clock CLK1. When the transistors Q5 and Q6 are OFF, the gate electrodes of the transistors Q2 and Q4 have a floating state but maintain the previous state due to the gate capacitances thereof.

Next, a description will be given of an embodiment of a method of producing a blanking aperture array according to the present invention, by referring to FIGS. 21 and 22.

Figure 21A:
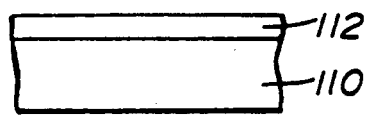
FIGS. 21A through 21D and FIGS. 22A through 22D are cross sectional views for explaining an embodiment of a method of producing a blanking aperture array according to the present invention.
Figure 21B:
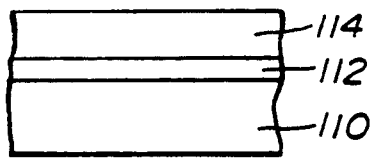
Figure 21C:
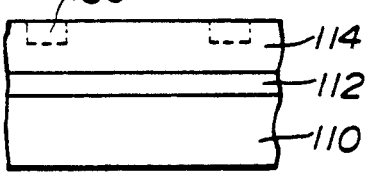

In FIG. 21A, an impurity diffusion layer 112 is formed in a semiconductor substrate 110 by an implanting impurities therein, and an epitaxially grown layer 114 is formed on the impurity diffusion layer 112 as shown in FIG. 21B. Next, as shown in FIG. 21C, elements 130 are formed in the epitaxially grown layer 114. The elements 130 are MOS transistors or the like which form the inverters and gates. The shift registers are made up of units of inverters and gates and extend in the row direction, while the first and second clock signal lines extend in the column direction. The shift registers and the signal lines are formed between the rows and columns of the apertures AP.

Figure 22A:
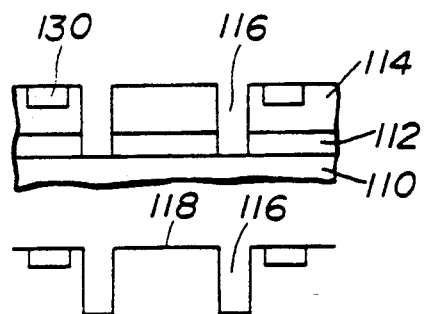
Figure 22B:
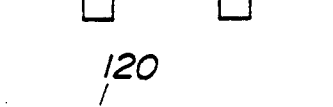
Figure 22C:
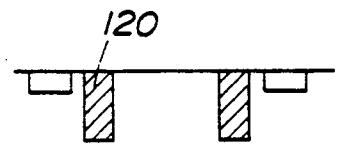
Figure 22D:
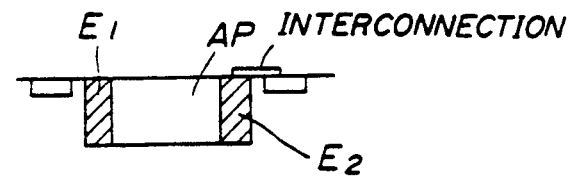

The aperture AP is formed as shown in FIGS. 22A through 22D. As shown in FIG. 22A, a narrow groove 116 which reaches the substrate 110 is formed by a trench etching at the position of the pair of confronting sides of each aperture in the epitaxially grown layer 114. Then, as shown in FIG. 22B, an insulator layer 118 is formed on the entire surface of the structure shown in FIG. 22A, and an electrode material 120 is filled inside the groove 116 to form the electrodes E1 and E2 as shown in FIG. 22C. Finally, the epitaxially grown layer 114 and the impurity diffusion layer 112 between the electrodes E1 and E2 are removed by an etching.

Figure 21D:
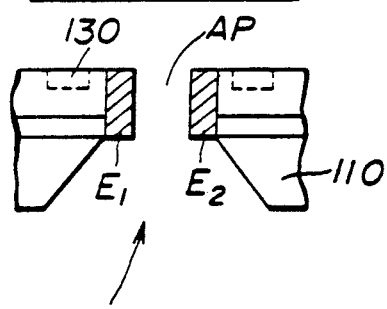

Next, a taper etching is made from the back surface of the substrate 110 as shown in FIG. 21D. As a result, the aperture AP is completed.

One of the electrodes E1 and E2 of each aperture AP is connected to an output of a corresponding unit of the shift register while the other is connected to a lower potential GND or alternately connected to a higher and lower potentials $V_{DD}$ and GND. Such connections may be made during the production step in which the interconnections to the elements of the shift register and the clock signal lines are formed, or alternatively by an independent production step.

Figure 23:
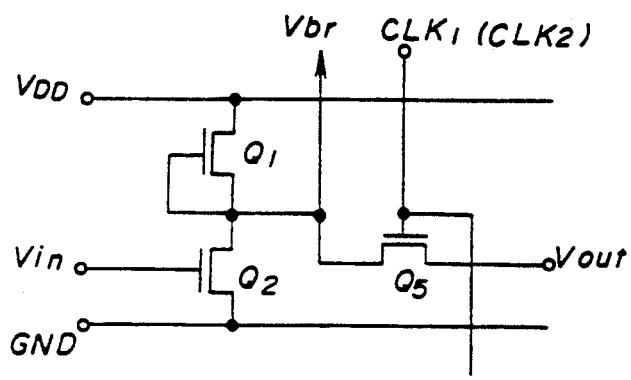
FIG. 23 is a circuit diagram showing an essential part of an eighth embodiment of the blanking aperture array according to the present invention.
Figure 24:
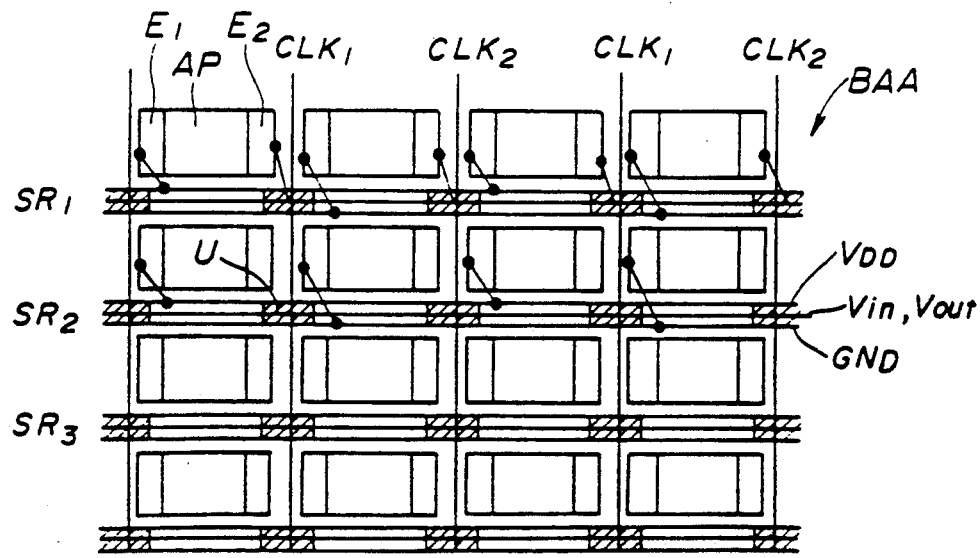
FIG. 24 is a plan view showing an essential part of the eighth embodiment.

Next, a description will be given of an eighth embodiment of the blanking aperture array according to the present invention, by referring to FIGS. 23 and 24. FIG. 23 is a circuit diagram showing the shift register which is used in this embodiment, and FIG. 24 shows the arrangement of the shift registers in the blanking aperture array.

As shown in FIG. 23, one unit of the shift register in this embodiment is made up of one inverter and one gate. In this case, an output voltage Vout is inverted with respect to an input voltage Vin, and the voltage which is applied to the blanking electrode of the aperture must be inverted and returned to the original polarity.

In other words, the electrodes E1 of the apertures AP are not grounded in common. Instead, the electrodes E1 are alternately connected to the power source potential $V_{DD}$ and the ground potential GND in the row direction.

In addition, the gates Q5 in the unit alternately receive the first and second clocks CLK1 and CLK2 in the row direction. Accordingly, when two units in FIG. 23 are considered to make up one block, this block forms a shift register similar to that shown in FIG. 19.

The shift operation of the shift register shown in FIG. 23 is basically the same as that of the shift register shown in FIG. 19.

For example, 200 shift registers respectively made up of 200 units shown in FIG. 23 are provided in the blanking aperture array BAA. The data input to this blanking aperture array BAA can be made similarly as described above for each unit.

The output of a corresponding unit is applied to the electrode E2 of each aperture AP even during the data shift. However, when the electron beam is irradiated on the blanking aperture array BAA after the shift operation ends and each of the units output desired signal levels, it is possible to form the cross sectional shape of the electron beam which is used for the exposure to the desired shape.

In the shift register shown in FIG. 23, the output of the units are alternately inverted and non-inverted. The input data may be processed beforehand by taking this into account, but it is also possible to make all outputs non-inverted by re-inverting the potential at each electrode E1. In other words, as shown in FIG. 24, when the power source potential $V_{DD}$ is applied to the electrode E1 of each aperture AP which corresponds to the odd numbered unit counted from the input side of the shift register, the output data becomes "0" (low level) when the input data is "1" (high level) and the electrode E2 receives a low level, but because the electrode E1 receives a high level the field acts on this aperture AP and the beam is deflected so as not to reach the wafer (assuming that the beam is OFF for the data "1"). On the other hand, the electrode E1 of the aperture AP which corresponds to each even numbered unit of the shift register is connected to the ground potential GND, so that the beam is turned ON/OFF depending on the high/low levels at the other electrode E2. The output from each odd numbered unit is non-inverted and need not be inverted.

In FIG. 24, the high and low level signals applied to the electrode E1 is in principle the high and low level signals output from each unit of the shift register, and the inversion/non-inversion is made depending on the high and low level signals applied to the electrode E1. Although the electrodes E1 of the apertures AP are grounded in common, it is possible to connect the electrodes E1 in common to the power source $V_{DD}$. In this case, the signals are all inverted and it is thus necessary to also invert the input data.

According to the seventh and eighth embodiments, it is possible to form the shift registers and the clock signal lines within the narrow regions between the rows and columns of the apertures in the two-dimensional blanking aperture array. One unit of the shift register corresponds to one aperture. One unit can be formed from six transistors in the case of the seventh embodiment shown in FIG. 19, and one unit can be formed from three transistors in the case of the eighth embodiment shown in FIG. 23. The number of interconnections along the row direction is three in total, that is, two power source lines and one signal line, for the embodiments shown in FIGS. 19 and 23. The number of clock signals lines in the column direction is two for the embodiment shown in FIG. 19 and one for the embodiment shown in FIG. 23. Accordingly, when the width of the lattice is 3 $\mu m$ and the interconnection width is 0.5 $\mu m$, for example, the required interconnections and shift registers can be satisfactorily accommodated within the width of the lattice.

In FIG. 21, a silicon substrate is suitable for use as the semiconductor substrate 110. The impurity diffusion layer 112 is formed for the purpose of forming a stopper layer with respect to the etching. Hence, the groove 116 can be formed from the surface to the impurity diffusion layer 112 and the taper etching can be made from the back surface to the impurity diffusion layer 112, so as to form the aperture AP which opens at the back surface of the semiconductor substrate 110. The electrode material 120 may be filled into the groove 116 by forming a doped polysilicon layer by a CVD and patterning the doped polysilicon layer.

In the embodiment shown in FIG. 19, the gate Q5 may be omitted and the output of the first inverter (Q1 and Q2) may be applied directly to the second inverter (Q3 and Q4), that is, to the gate electrode of the transistor Q4, and take this structure as one unit of the shift register. In this case, the clock to the gate Q6 is alternately the clock CLK1 and the clock CLK2 between the adjacent units, so that it is possible to obtain a shift register which does not have the units with the inverted and non-inverted outputs. Similarly, the gate Q6 may be omitted in place of the gate Q5 and the clocks CLK1 and CLK2 may be supplied alternately to the adjacent units.

According to the seventh and eighth embodiments, it is possible to easily realize a charged particle beam exposure which uses the blanking aperture array and is far superior to other lithography techniques in terms of the fineness of the pattern exposed, the positioning accuracy, the quick turnaround and the reliability. In addition, since the number of elements and interconnections which must be formed within the limited width of the lattice is small, it is possible to easily realize the two-dimensional blanking aperture array which has a fine lattice width.

Further, the present invention is not limited to these embodiments, but various variations and modifications may be made without departing from the scope of the present invention.

What is claimed is:

1. A method of producing a blanking aperture array comprising the steps of:
   preparing a stacked structure including a semiconductor substrate, an impurity diffusion layer formed on a top surface of said semiconductor substrate and an epitaxial layer formed on said impurity diffusion layer;
   forming a plurality of shift registers generally along a first direction and clock signal lines generally along a second direction on said epitaxial layer, each of said shift registers comprising a plurality of shift register parts which are coupled in series, each shift register part including an inverter and a gate, said clock signal lines being coupled to the gates of said shift register part, said first and second directions being mutually perpendicular;
   forming rows and columns of apertures between said shift registers and said clock signal lines, each of said apertures having a pair of blanking electrodes, said rows extending in said first direction, said columns extending in said second direction; and
   connecting one of the pair of blanking electrodes of each aperture to an output of a corresponding one of said shift register parts and the other of the pair of blanking electrodes of each aperture to a potential line 2. The method of producing the blanking aperture array as claimed in claim 1 wherein said step of forming apertures includes the substeps of:
   forming a pair of grooves in said epitaxial layer which reach said semiconductor substrate at positions on both confronting sides of each aperture by a trench etching;
   forming an insulator layer on a surface of each pair of said grooves;
   filling an electrode material within each pair of said grooves;
   removing said epitaxial layer and said impurity diffusion layer between each of said pair of grooves by an etching; and
   forming an aperture by between each pair of said grooves by a taper etching made from a bottom surface of said semiconductor substrate.

3. The method of producing the blanking aperture array as claimed in claim 1 wherein said step of connecting the blanking electrodes connects said other of the pair of blanking electrodes of each aperture alternately to first and second potential lines along said first direction, said first potential line having a higher potential than said second potential line.

4. The method of producing the blanking aperture array as claimed in claim 1, wherein each aperture includes a pair of spaced, confronting sidewalls, and wherein said step of forming apertures includes the substeps of:
   forming a pair of grooves extending through said stacked epitaxial and impurity diffusion layers and reaching said semiconductor substrate, at positions respectively corresponding to and defining the corresponding portions of the confronting sidewalls of each aperture, by a trench etching step;
   forming an insulator layer on the surface of each of said pair of grooves;
   filling each of said pair of grooves with an electrode material, said electrode material being impurity doped polysilicon;
   removing the portions of said epitaxial layer and said impurity diffusion layer between each of said pair of grooves by an etching step; and
   completing the remaining portions of the sidewalls of each aperture, extending through the semiconductor substrate, by taper etching said semiconductor substrate in the direction from the bottom surface to the top surface thereof.

5. The method of producing the blanking aperture array as claimed in claim 4, wherein said substep of filling each of said pair of grooves with an electrode material is performed by a step of chemical vapor deposition of the impurity doped polysilicon into each of said pair of grooves.

* * * * *

UNITED STATES PATENT AND TRADEMARK OFFICE
CERTIFICATE OF CORRECTION

PATENT NO. : 5,262,341
DATED : November 16, 1993
INVENTOR(S) : Shunsuke Fueki, et al It is certified that error appears in the above-indentified patent and that said Letters Patent is hereby corrected as shown below:

Col. 2, line 60, change "meaks" to --mask--.

Col. 9, line 4, change "improve" to --improved--.

Col. 13, line 19, change "Si" to --S1--.

Signed and Sealed this

Eighth Day of November, 1994

Attest:

BRUCE LEHMAN

Attesting Officer

Commissioner of Patents and Trademarks